(12) United States Patent
Wajima

(10) Patent No.: US 6,373,169 B1
(45) Date of Patent: Apr. 16, 2002

(54) CAPACITOR-CONTAINING PIEZOELECTRIC RESONANCE COMPONENT

(75) Inventor: Masaya Wajima, Shinminato (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/688,405

(22) Filed: Oct. 16, 2000

(30) Foreign Application Priority Data

Oct. 15, 1999 (JP) .......................................... 11-294255

(51) Int. Cl.[7] .............................................. H01L 41/04
(52) U.S. Cl. ...................................... 310/320; 310/366
(58) Field of Search ................................ 310/348, 326, 310/366; H03H 9/02

(56) References Cited

U.S. PATENT DOCUMENTS

6,215,229 B1 * 4/2001 Kuroda ........................ 310/348

FOREIGN PATENT DOCUMENTS

| JP | 3-240311 | * 10/1991 | ............ H03H/9/02 |
| JP | 04103208 A | * 4/1992 | ............ H03H/3/04 |
| JP | 7-94997 | 4/1995 | |
| JP | 7-094997 | * 7/1995 | ............ H03H/9/02 |

* cited by examiner

Primary Examiner—Nestor Ramirez
Assistant Examiner—Karen B Addison
(74) Attorney, Agent, or Firm—Keating & Bennett, LLP

(57) ABSTRACT

A capacitor-containing piezoelectric resonance component is constructed to minimize variations in electrostatic capacitance. The component includes dielectric substrates that are disposed on upper and lower surfaces of an energy-trap type piezoelectric resonance element such that a vibration space is defined. On the dielectric substrates, first and second capacitor-defining electrodes are disposed to define a predetermined gap G in a direction that is substantially parallel to the main surface of the dielectric substrate. The second capacitor-defining electrode overlaps with the vibration space via either the dielectric substrates or portions of the dielectric substrates. When G' represents the distance between an end portion of the second capacitor-defining electrode and an end portion of the vibratory space along the direction in which the first and the second capacitor-defining electrode oppose each other, one of the expressions $G'/G \geq 1$ and $G'/G \leq -0.4$ is satisfied.

24 Claims, 27 Drawing Sheets

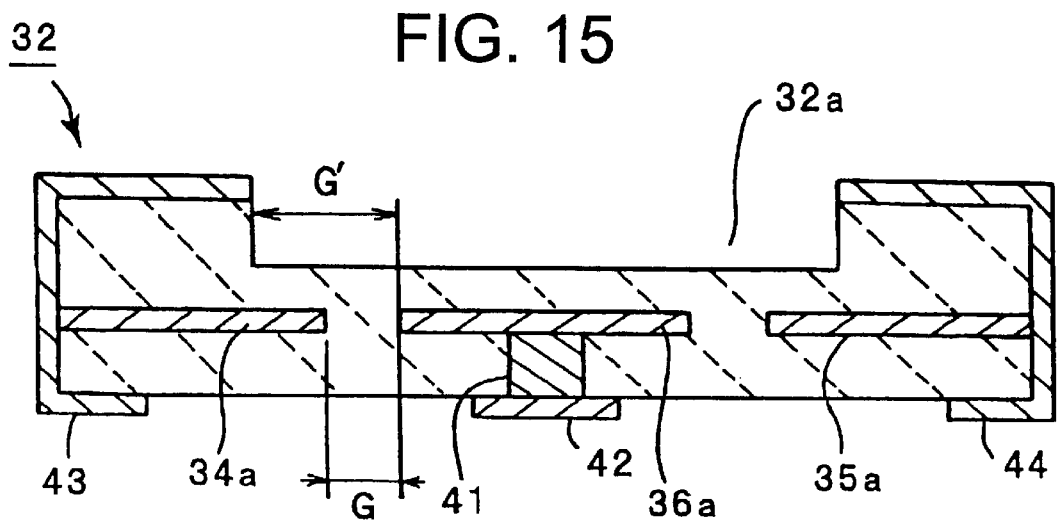

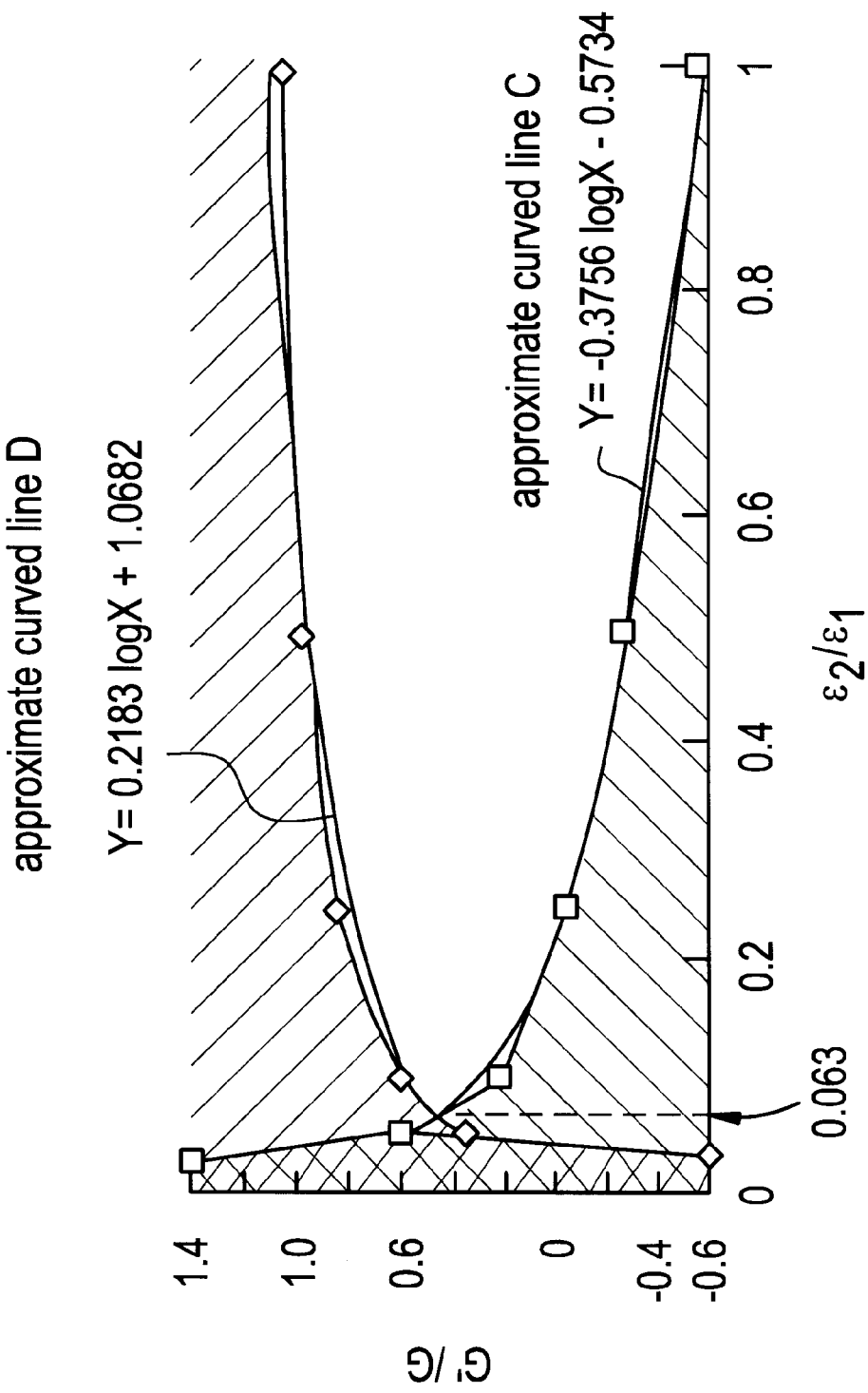

CAPACITOR-CONTAINING PIEZOELECTRIC RESONANCE COMPONENT

BACKGROUND OF THE INVENTION

1. Field of the Invention

The present invention relates to a piezoelectric resonator containing electrostatic capacitors, and more particularly, the present invention relates to a capacitor-containing piezoelectric resonance component having an improved arrangement of electrodes arranged to define capacitors and spaces for allowing for free and unhindered vibration of the vibration portion of the piezoelectric resonator.

2. Description of the Related Art

Conventionally, capacitor-containing piezoelectric resonance components have widely been used as piezoelectric vibrators. For example, Japanese Unexamined Patent Application Publication No. 7-94997 discloses a capacitor-containing piezoelectric resonance component 201, as shown in FIG. 32. In the capacitor-containing piezoelectric resonance component 201, dielectric substrates 203 and 204 are, respectively, disposed on upper and lower surfaces of a piezoelectric resonance element 202. The piezoelectric resonance element 202 uses one of a thickness-vertical vibration mode and a thickness-extensional sliding mode that are energy-trap type vibration modes. Vibration spaces 205 and 206 are arranged to allow for free and unhindered vibration in the vibrating section of the piezoelectric resonance element 202. In the conventional example, each of the vibration spaces 205 and 206 is defined by a concave section formed in one of the main surfaces of each of the dielectric substrates 203 and 204, respectively.

In the resonance component 201, capacitor-forming electrodes 207 to 209 are disposed on outer surfaces of the layered body defined by the stacked dielectric substrates 203 and 204 to define capacitors. The capacitor-forming electrode 208 is connected to a ground potential. The capacitors are positioned individually between the capacitor-forming electrodes 207 (hot side) and 208 and between the capacitor-forming electrodes 209 (hot side) and 208.

In addition, Japanese Unexamined Patent Application Publication No. 3-240311 discloses a capacitor-containing piezoelectric resonance component 211, as shown in FIG. 33. In the capacitor-containing piezoelectric resonance component 211, dielectric substrates 213 and 214 are disposed on upper and lower surfaces of a piezoelectric resonance element 212. In this conventional example, the dielectric substrates 213 and 214 are individually adhered to a piezoelectric resonance element 212 via insulating adhesive layers 215 and 216, respectively. Vibration spaces 217 and 218 are formed of openings in the respective insulating adhesive layers 215 and 216. Similarly to the capacitor-containing piezoelectric resonance component 201, capacitor-forming electrodes 219 to 221 are disposed on outer surfaces of the layered body including the stacked dielectric substrates 213 and 214 to define capacitors.

In each of the capacitor-containing piezoelectric resonance components 201 and 211, capacitors are individually defined between the intermediate capacitor-forming electrodes 208 and 220 (which are connected to the ground potential) and the oppositely arranged capacitor-forming electrodes 207 and 219, respectively, via a predetermined gap G and between the intermediate capacitor-forming electrodes 208 and 220 and the oppositely arranged capacitor-forming electrodes 209 and 221, respectively, via the predetermined gap G. In these cases, the electrostatic capacitance of each of the capacitors depends on the relative permittivity of the dielectric substrate, the size of the gap G between the capacitor-forming electrodes, and other such factors.

In the capacitor-containing piezoelectric resonance components 201 and 211 described above, however, a problem arises in that the electrostatic capacitance of the capacitors varies according to variations in the positions of the capacitor-forming electrodes 208 and 220.

SUMMARY OF THE INVENTION

In order to overcome the problems described above, preferred embodiments of the present invention provide a capacitor-containing piezoelectric resonance component that minimizes and eliminates variation in the electrostatic capacitance.

According to one preferred embodiment of the present invention, a capacitor-containing piezoelectric resonance component includes an energy-trap piezoelectric resonance element having a piezoelectric plate, and a first vibratory electrode and a second vibratory electrode that are individually disposed on portions of two main surfaces of the piezoelectric plate so that a lower surface and an upper surface thereof oppose each other via the piezoelectric plate. A dielectric substrate is disposed on at least one surface of the piezoelectric resonance element with a vibratory space being defined to allow for free and unhindered vibration of a vibrating section. A first capacitor-forming electrode and a second capacitor-forming electrode are arranged on the dielectric substrate so as to oppose each other via a predetermined gap G in a direction that is substantially parallel to the main surface of the dielectric substrate. When G′ represents the distance between an end portion of the second capacitor-forming electrode and an end portion of the vibration space along the direction in which the first capacitor-forming electrode and the second capacitor-forming electrode oppose each other, at least one of the following expressions is satisfied:

$$G'/G \geq 1 \text{ and } G'/G \leq -0.4.$$

As described above, since the ratio G′/G is within the desired range, even in a case where positions of the first and second capacitor-forming electrodes vary, arranging the ratio of G′/G to be within the specific range allows the variation in electrostatic capacitance to be significantly reduced. This is especially effective in a case where the position of the second capacitor-forming electrode varies. Therefore, capacitor-containing piezoelectric resonance components having excellent characteristics are easily obtained with this unique construction. In addition, since manufacturing precision of forming the capacitor-forming electrodes need not be improved, productivity of the capacitor-containing piezoelectric resonance component is greatly improved.

According to another preferred embodiment of the present invention, a capacitor-containing piezoelectric resonance component includes an energy-trap piezoelectric resonance element having a piezoelectric plate, and a first vibratory electrode and a second vibratory electrode that are individually disposed on portions of two main surfaces of the piezoelectric plate so that a lower surface and an upper surface thereof oppose each other via the piezoelectric plate. A dielectric substrate is disposed on at least one surface of the piezoelectric resonance element with a vibration space being secured therein for allowing for free and unhindered vibration of a vibrating section of the resonance element. A dielectric layer is disposed between the piezoelectric resonance element and the dielectric substrate and includes an opening provided for defining at least a portion of the vibration space. When $\epsilon_1$ represents the relative permittivity of the dielectric substrate and $\epsilon_2$ represents the relative permittivity of the dielectric layer, a relationship $\epsilon_2/\epsilon_1 \leq 0.063$ is satisfied.

As described above, since the $\epsilon_2/\epsilon_1$ ratio is within the desired range, even in a case where positions of the first and second capacitor-forming electrodes vary, arranging the $\epsilon_2/\epsilon_1$ ratio to be within the desired range minimizes the variation in electrostatic capacitance to be significantly reduced. Particularly, this is especially effective in a case where the position of the second capacitor-forming electrode varies. Therefore, capacitor-containing piezoelectric resonance components having excellent characteristics are easily obtained. In addition, since precision of the capacitor-forming electrodes need not be improved, productivity of the capacitor-containing piezoelectric resonance component is greatly improved.

According to still another preferred embodiment of the present invention, a capacitor-containing piezoelectric resonance component includes an energy-trap piezoelectric resonance element having a piezoelectric plate, and a first vibratory electrode and a second vibratory electrode that are individually disposed on portions of two main surfaces of the piezoelectric plate so that a lower surface and an upper surface thereof oppose each other via the piezoelectric plate. A dielectric substrate is disposed on at least one surface of the piezoelectric resonance element with a vibration space being secured therein for allowing free and unhindered vibration of a vibrating section of the resonance element. A dielectric layer is disposed between the piezoelectric resonance element and the dielectric substrate and includes an opening provided for defining at least a portion of a vibratory space. A first capacitor-forming electrode and a second capacitor-forming electrode that are provided on the dielectric substrate so as to oppose each other via a predetermined gap G in a direction that is substantially parallel to the main surface of the dielectric substrate. When G' represents the distance between an end portion of the second capacitor-forming electrode and an end portion of the vibratory space along the direction in which the first capacitor-forming electrode and the second capacitor-forming electrode oppose each other, $\epsilon_1$ represents the relative permittivity of the dielectric substrate, and $\epsilon_2$ represents the relative permittivity of the dielectric layer, at least one of the following relationships is satisfied: $\epsilon_2/\epsilon_1 > 0.063$ and $G'/G > 0.2183\log(\epsilon_2/\epsilon_1) + 1.0682$ or $\epsilon_2/\epsilon_1 > 0.063$ and $G'/G \leq -0.3756\log(\epsilon_2/\epsilon_1) - 0.5734$.

According to the above-described unique construction, since the ratio $\epsilon_2/\epsilon_1$ and the ratio $G'/G$ are both within desired ranges, even in a case where positions of the first and second capacitor-forming electrodes vary, arranging the $G'/G$ ratio to be within the specific range minimizes and eliminates variation in electrostatic capacitance. This is especially effective in a case where the position of the second capacitor-forming electrode varies. Therefore, capacitor-containing piezoelectric resonance components having excellent characteristics are easily obtained. In addition, since manufacturing precision of the capacitor-forming electrodes need not be improved, productivity of the capacitor-containing piezoelectric resonance component is greatly improved.

In the above-described capacitor-containing piezoelectric resonance component, a pair of the first capacitor-forming electrodes may be arranged so as to sandwich the second capacitor-forming electrode in the direction in which the pair of first capacitor-forming electrodes and the second capacitor-forming electrode oppose each other so as to be electrically connected to the piezoelectric resonance element, and the second capacitor-forming electrode is connected to a ground potential.

According to the above-described unique construction, the capacitor-containing piezoelectric resonance component is preferably a three-terminal type wherein one terminal is connected to the ground terminal. Therefore, the capacitor-containing piezoelectric resonance component that greatly reduces the variation in the electrostatic capacitance is provided.

In a capacitor-containing piezoelectric resonance component of various preferred embodiments of the present invention, the dielectric substrate may be disposed on each of two main surfaces of the piezoelectric resonance element with the vibratory space being reliably provided.

The above-described unique construction allows the overlaid-type capacitor-containing piezoelectric resonance component to minimize the variation in the electrostatic capacitance.

Also, the above-described capacitor-containing piezoelectric resonance component may further include a cap-like casing member, wherein the dielectric substrate is larger than the piezoelectric resonance element, and the cap-like casing member is fixed on the dielectric substrate so as to contain the piezoelectric resonance element.

The above-described arrangement provides a capped-type capacitor-containing piezoelectric resonance component that minimizes variation in the electrostatic capacitance.

In addition, the above-described capacitor-containing piezoelectric resonance component may further include a casing substrate that is larger than the dielectric substrate and the piezoelectric resonance element and a cap-like casing member for confining the piezoelectric resonance element and the dielectric substrate, wherein the structure in which the piezoelectric resonance element and the dielectric substrate are overlaid is mounted on the casing substrate, and the cap-like casing member is adhered to the casing substrate.

The above-described construction also allows the provision of the capacitor-containing piezoelectric resonance component that eliminates and minimizes variation in the electrostatic capacitance and that has stable, excellent characteristics. In this case, the capacitor-containing piezoelectric resonance component contains the capacitors defined by the piezoelectric resonance element and the dielectric substrate in a package structure including the casing substrate and the cap-like casing member.

Furthermore, in the above-described capacitor-containing piezoelectric resonance component, the first and second capacitor-forming electrodes may be arranged to oppose each other via the predetermined gap G on an outer surface of the dielectric substrate.

In this case, since the capacitor-forming electrodes are preferably formed only on an outer surface of the dielectric substrate, the capacitor-forming electrodes are easily formed.

Yet furthermore, in the above-described capacitor-containing piezoelectric resonance component, at least one of the first and second capacitor-forming electrodes may be located at an intermediate height in the dielectric substrate to define an inner electrode.

In this case, by controlling the position where the inner electrode is located, a variety of built-in capacitors can be provided, and also, the capacitor-containing piezoelectric resonance component having high anti-moisture characteristics is achieved.

Still furthermore, in the described capacitor-containing piezoelectric resonance component, at least one of the first and second capacitor-forming electrodes may be disposed on a surface of the dielectric substrate on the side where the dielectric substrate is overlaid on the piezoelectric resonance element.

In this case, since the capacitor-forming electrodes can be formed only on an outer surface of the dielectric substrate, the capacitor-forming electrodes can be easily formed.

BRIEF DESCRIPTION OF THE DRAWINGS

FIG. 15 is a vertical cross-sectional view of a modified example of the dielectric substrate shown in FIG. 13;

FIG. 21 is a graph showing the relationships between the ratios $\epsilon_2/\epsilon_1$ and G'/G in the capacitor-containing piezoelectric resonance component of the fifth preferred embodiment of the present invention;

DETAILED DESCRIPTION OF PREFERRED EMBODIMENTS

Hereinbelow, referring to the accompanying drawings, preferred embodiments of the present invention will be described.

Figure 1A:
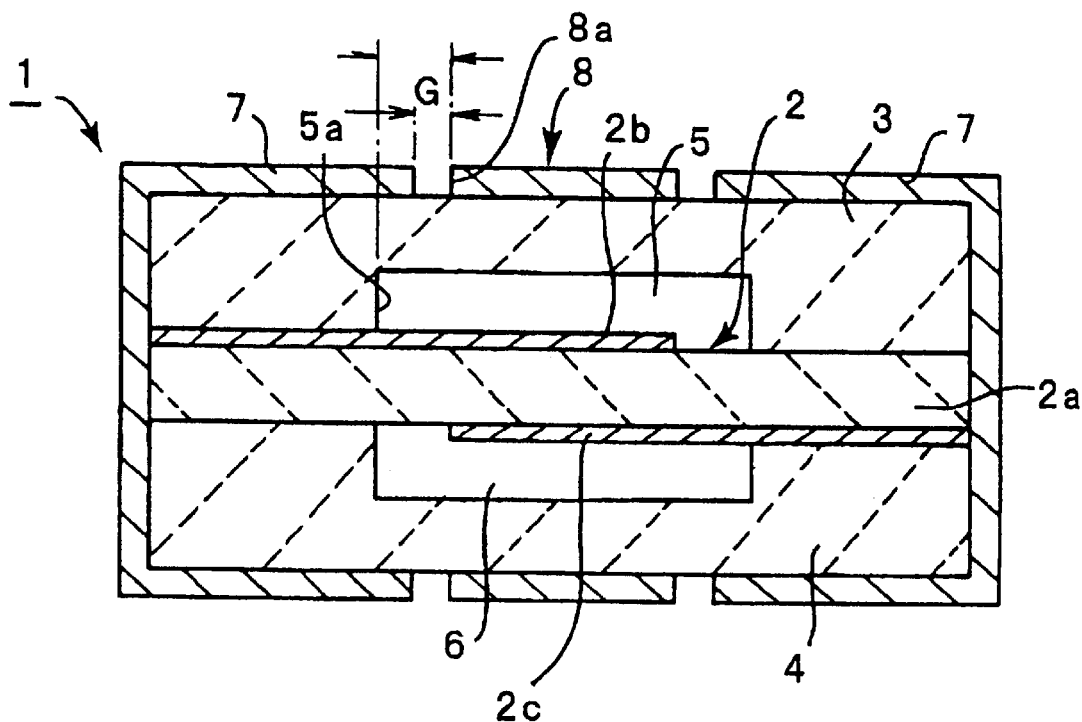
FIGS. 1A and 1B are, respectively, a vertical cross-sectional view of a capacitor-containing piezoelectric resonance component according to a first preferred embodiment of the present invention and an enlarged partial cross-sectional view showing important portions of the first preferred embodiment of the present invention.
Figure 1B:
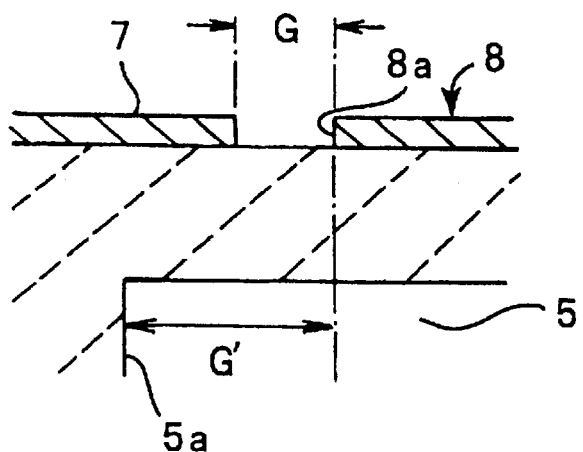
Figure 2:
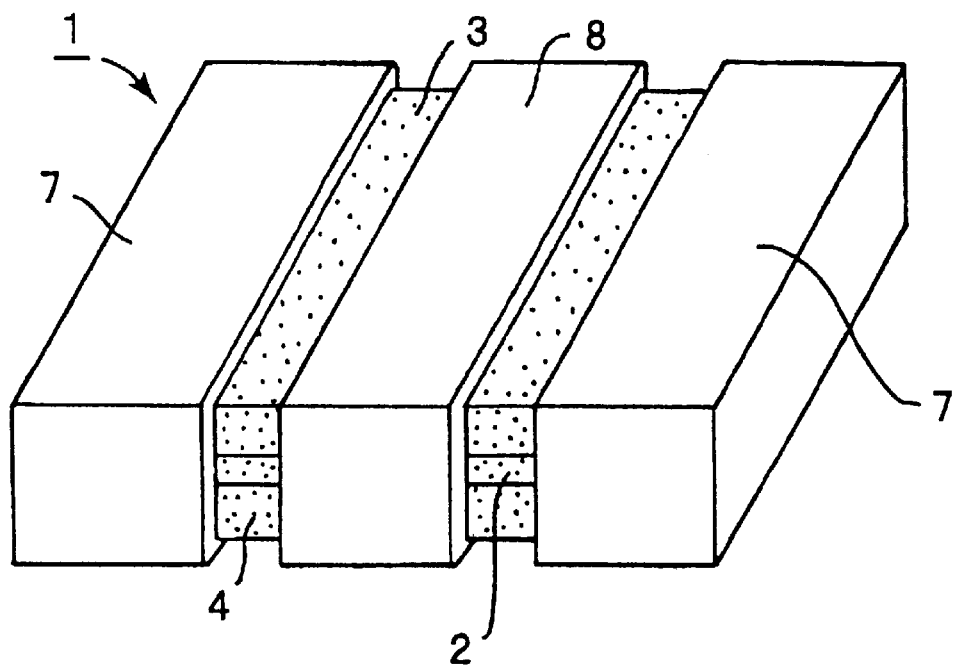
FIG. 2 is a perspective view showing the appearance of the capacitor-containing piezoelectric resonance component according to the first preferred embodiment of the present invention.

FIG. 1A is a cross-sectional view of a capacitor-containing piezoelectric resonance component 1 according to a first preferred embodiment of the present invention, and FIG. 1B is an enlarged cross-sectional view of important portions of the first preferred embodiment of the present invention. FIG. 2 is a perspective view showing the appearance of the capacitor-containing piezoelectric resonance component 1.

In the chip-type capacitor-containing piezoelectric resonance component 1, dielectric substrates 3 and 4 are disposed on upper and lower surfaces, respectively, of a plate-like piezoelectric resonance element 2.

Figure 3:
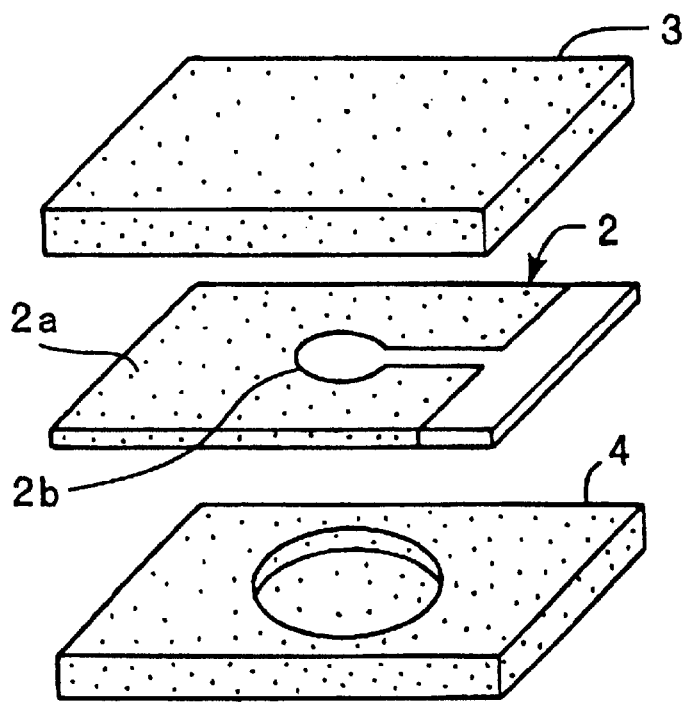
FIG. 3 is an exploded perspective view showing dielectric substrates and a piezoelectric resonance element included in the first preferred embodiment.
Figure 4:
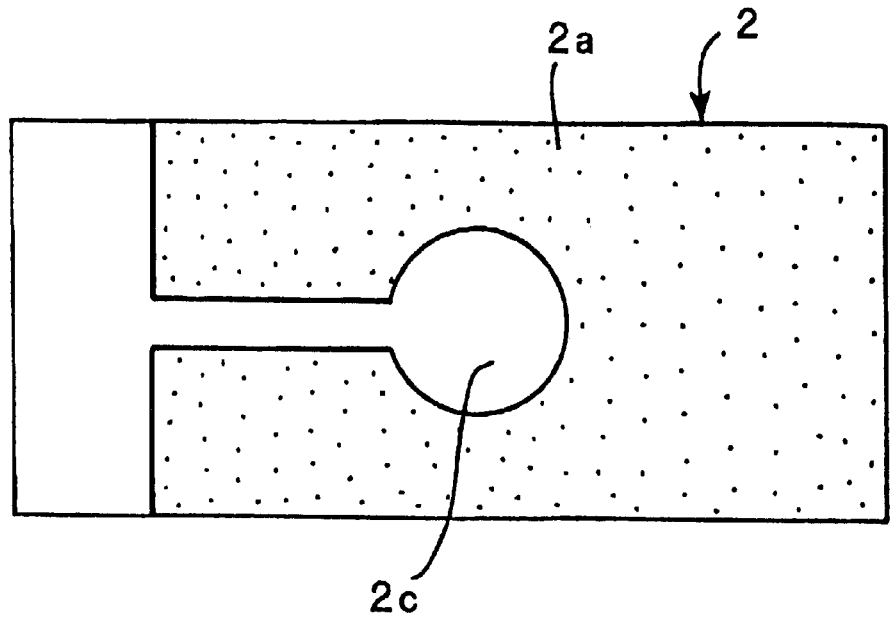
FIG. 4 is a bottom plan view showing an electrode on a lower surface of the piezoelectric resonance element included in the first preferred embodiment.

As shown in FIGS. 3 and 4, the piezoelectric resonance element 2 preferably has a substantially rectangular piezoelectric plate 2a and resonance electrodes 2b and 2c. The resonance electrodes 2b and 2c are arranged so as to overlap with each other, with the piezoelectric plate 2a being located therebetween. Portions where the resonance electrodes 2b and 2c overlap with each other are arranged to define an energy-trap vibration section.

The piezoelectric plate 2a may be formed of an appropriate piezoelectric material, for example, a piezoelectric ceramic such as a lead-titanate-zirconate-based ceramic or a piezoelectric single-crystal material such as quartz. In the first preferred embodiment, a piezoelectric ceramic is preferably used to form the resonance plate 2a. The piezoelectric ceramic is polarized in the thickness direction, thereby forming the energy-trap piezoelectric resonance element 2 that vibrates in a thickness-vertical vibration mode.

Each of the dielectric substrates 3 and 4 preferably has a concave section on its internal surface. The concave sections individually define spaces 5 and 6 provided for allowing for free and unhindered vibration of the vibrating section of the resonance component. The dielectric substrates 3 and 4 are mounted to the piezoelectric resonance element 2 preferably by using insulating adhesives (not shown). The dielectric substrates 3 and 4 are formed of, for example, an alumina dielectric ceramic. In this case, for example, either a titanate-barium-based ceramic or a titanate-strontium-based ceramic that has a high relative permittivity is preferably used to obtain large electrostatic capacitance between capacitor-forming electrodes described below.

As described above, the dielectric substrates 3 and 4 are disposed on the upper and lower surfaces, respectively, of the piezoelectric resonance element 2. According to various preferred embodiment of the present invention, however, a dielectric substrate may be formed only on one of the main surfaces of a piezoelectric resonance element.

As shown in FIG. 1A, in the capacitor-containing piezoelectric resonance component 1, first capacitor-forming electrodes 7 and a second capacitor-forming electrode 8 are provided on an outer surface of a layered body including the dielectric substrates 3 and 4. As clearly shown in FIG. 2, at end portions of the layered body, the first capacitor-forming electrodes 7 are arranged so as to cover upper-surface portions, a pair of side-surface portions, and lower surface portions. At the approximate center of the layered body in the longitudinal direction, the second capacitor-forming electrode 8 is arranged so as to wind about an upper-surface portion, a pair of side-surface portions, and a lower-surface portion. Also, the second capacitor-forming electrode 8 is arranged so as to overlap with the vibratory space 5 via the dielectric substrate 3. As shown in FIG. 1B, the first and second capacitor-forming electrodes 7 and 8 oppose each other via a gap G.

The capacitor-containing piezoelectric resonance component 1 according to the first preferred embodiment is characterized as follows. In the configuration, G' represents the distance between an end portion 5a of the vibration space 5 and an end portion 8a of the second capacitor-forming electrode 8 along the direction in which the first capacitor-forming electrodes 7 and the second capacitor-forming electrode 8 oppose each other. In this case, the relationship between G' and G is expressed in one of the following expressions: $G'/G \geq 1$ and $G'/G \leq -0.4$. The end portion 5a and the end portion 8a are defined such that, in a case where the end portion 5a is one end of the vibration space 5 in the aforementioned opposing direction, the end portion 8a (on the side of the end portion 5a) of the second capacitor-forming electrode 8 defines the aforementioned distance G'.

Thus, in the capacitor-containing piezoelectric resonance component 1, since the G'/G ratio is within the above-described desired range, variations in the electrostatic capacitance of the capacitors formed between the first capacitor-forming electrode 7 and the second capacitor-forming electrode 8 is minimized to about ±1% or less. Regarding the above-described preferred embodiment, a detailed description will be given below with reference to FIGS. 5A, 5B, 6, and 7A to 7D.

Figure 5A:
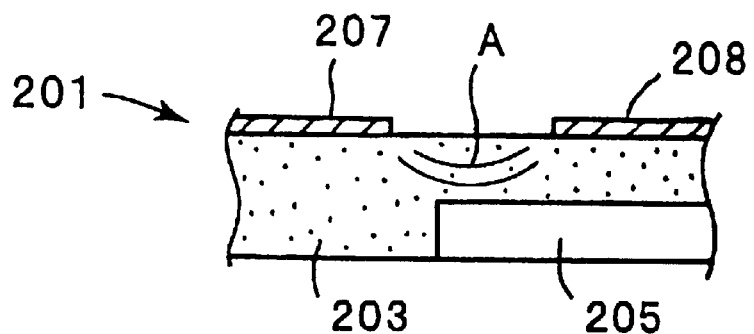
FIGS. 5A and 5B are partial cross-sectional views of conventional capacitor-containing piezoelectric resonance components, each showing electrical-force lines in a case where positions of capacitor-forming electrodes vary.
Figure 5B:
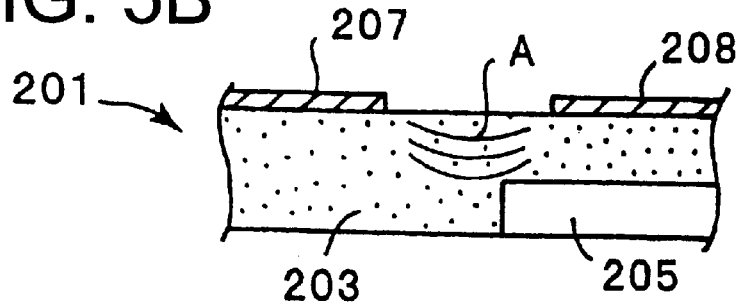

FIGS. 5A and 5B are partial cross-sectional views that will be used to explain how the electrostatic capacitance varies according to variation in the position where a second capacitor-forming electrode 208 is located.

As shown in FIGS. 5A and 5B, in a case where a first capacitor-forming electrode 207 and the second capacitor-forming electrode 208 are disposed on an outer surface of a dielectric substrate 203, a potential difference therebetween causes electrical-force lines to be distributed as indicated by solid lines A. This indicates that the electrical-force lines are influenced by a lower vibration space 205. This shows that, according to the positional variation between the second capacitor-forming electrode 208 positioned over the lower vibratory space 205 and the lower vibratory space 205 along the direction in which the first and the second capacitor-forming electrodes 207 and 208 oppose each other, variation occurs in the electrostatic capacitance obtained therein.

The inventors discovered that the electrostatic capacitance varies in the conventional capacitor-containing piezoelectric resonance components 201 and 211 (described in the Related Art) for the reasons described above. This motivated the inventors to develop various preferred embodiments of the present invention.

According to the above-described discovery, for the capacitor-containing piezoelectric resonance component 1 shown in FIG. 1, the inventors discovered that the ratio G'/G could be controlled to minimize variations in the electrostatic capacitance obtained therein. The results were as shown in FIG. 6.

Figure 6:
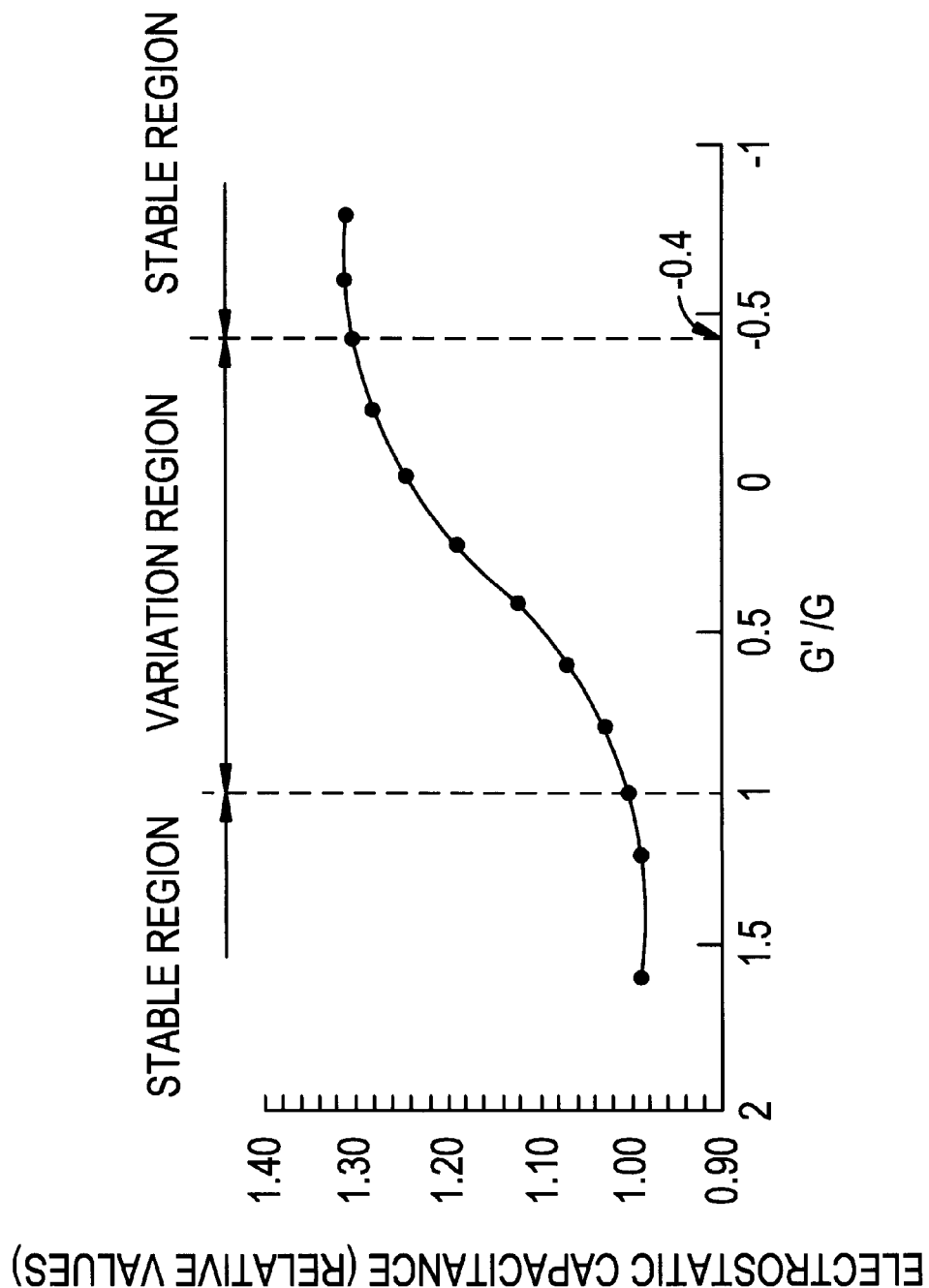
FIG. 6 shows the variation in electrostatic capacitance in a case where a ratio G'/G is varied in the capacitor-containing piezoelectric resonance component of the first preferred embodiment of the present invention.

In FIG. 6, the horizontal axis indicates the G'/G ratios, and the vertical axis indicates the electrostatic capacitance (relative value) obtained between the first capacitor-forming electrode 7 and the second capacitor-forming electrode 8. In the graph, in the case where the ratio G'/G=1, the electrostatic capacitance is assumed to be 1.00, and ratios to the value of electrostatic capacitance in the case where G'/G=1 in other cases, that is, in cases where the G'/G ratios is other than 1, are indicated as the electrostatic capacitance (relative value).

For the measurement for the piezoelectric resonance element 2, an equivalent piezoelectric resonance element having approximate dimensions of 2.5 mm×2.0 mm×0.25 mm (thickness) was used. For each of the substantially circular resonance electrodes 2b and 2c, an equivalent resonance electrode having a diameter of about 0.7 mm was used. For each of the dielectric substrates 3 and 4, an equivalent dielectric substrate formed of a titanate-barium-based ceramic having approximate dimensions of 2.5 mm×2.0 mm×0.40 mm was used.

Figure 7A:
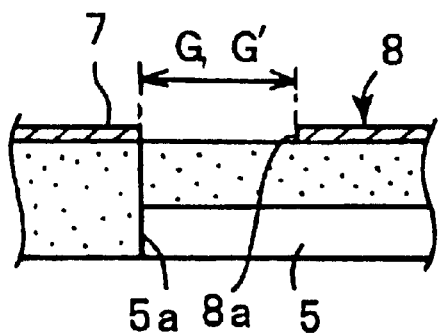
FIGS. 7A to 7D are partial cross-sectional views used to explain the relationships between G and G' in cases where a second capacitor-forming electrode is disposed at different positions in the capacitor-containing piezoelectric resonance component shown in FIG. 1.
Figure 7B:
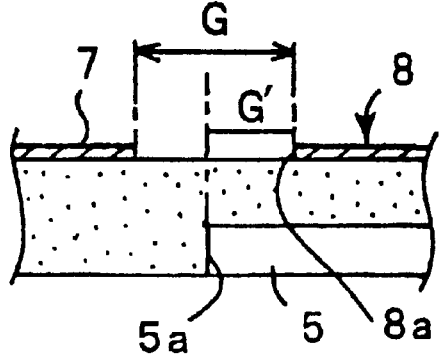
Figure 7C:
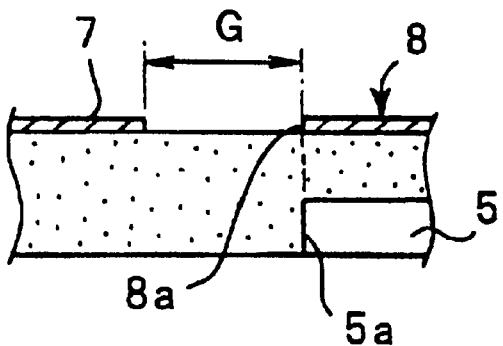
Figure 7D:
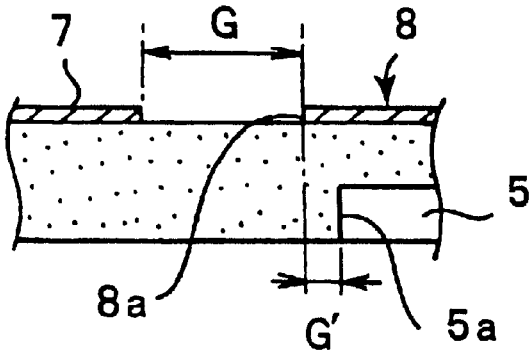

FIGS. 1B and 7A to 7D individually illustrate positional relationships between the capacitor-forming electrode and the vibratory space in cases of representative G'/G ratios. FIG. 1B illustrates the relationship in the case where G'/G>1. FIG. 7A illustrates the relationship in the case where G'/G=1. FIG. 7B illustrates the relationship in the case where G'/G>0, and concurrently, G'/G<1. FIG. 7C illustrates the relationship in the case where G'/G=0. FIG. 7D illustrates the relationship in the case where G'/G<0 (negative).

As will be quickly known from FIG. 6, in cases where G'/G≧1 and G'/G<−0.4, the electrostatic capacitance obtained therein is very stable. Therefore, arranging the configuration that has the above-described relationship represented by either G'/G≧1 or G'/G≦−0.4 allows the provision of the capacitor-containing piezoelectric resonance component 1 that eliminates and minimizes variations in the electrostatic capacitance.

In the above cases, the variation in the electrostatic capacitance is minimized for the reasons described below. In the case where G'/G≧1, as shown in FIG. 1B, the vibration space 5 is arranged to extend in the aforementioned opposing direction relative to both sides of regions where the first and second capacitor-forming electrodes 7 and 8 oppose each other. In this case, the electrostatic capacitance obtained between the first and second capacitor-forming electrodes 7 and 8 is very stable, that is, the variation in the electrostatic capacitance is minimized. On the other hand, in the case where G'/G≦−0.4, as shown in FIG. 7D, since the vibration space 5 is positioned only under the second capacitor-forming electrode 8, the variation in the electrostatic capacitance obtained between the first and second capacitor-forming electrodes 7 and 8 is minimized.

In the capacitor-containing piezoelectric resonance component 1 of the first preferred embodiment of the present invention, the above-described ratios G'/G are within the above-described specific range. Accordingly, a load-capacitor-containing piezoelectric resonator that eliminates and minimizes variations in the electrostatic capacitance is easily provided. For example, with the capacitor-containing piezoelectric resonance component 1 being used as a piezoelectric vibrator, variations in oscillation frequency are significantly reduced.

Figure 8:
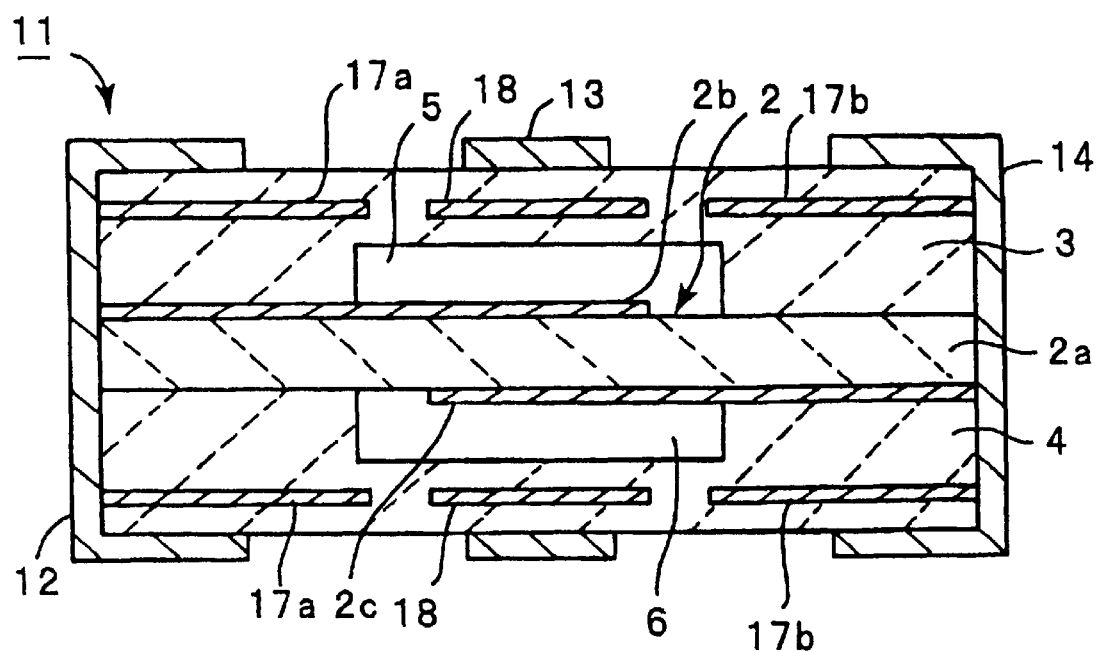
FIG. 8 is a cross-sectional view of a modified example of the capacitor-containing piezoelectric resonance component according to the first preferred embodiment of the present invention.

FIG. 8 is a cross-sectional view of a modified example of the capacitor-containing piezoelectric resonance component 1 according to the first preferred embodiment of the present invention.

In a modified chip-type capacitor-containing piezoelectric resonance component 11, first capacitor-forming electrodes 17a and 17b and a second capacitor-forming electrode 18 are arranged to define inner electrodes. Outer electrodes 12, 13, and 14 are electrically connected to the first capacitor-forming electrode 17a, the second capacitor-forming electrode 18, and the first capacitor-forming electrode 17b, respectively. The second capacitor-forming electrode 18 is led to at least one side-surface portion of the dielectric substrate 3 and is thereby connected to the outer electrode 13.

Each of the outer electrodes 12 and 14 is arranged so as to extend not only to an end surface portion of the load-capacitor-containing piezoelectric resonance component 11, but also to an upper-surface portion, a pair of side-surface portions, and a lower-surface portion thereof. As in this modified example, the first capacitor-forming electrodes 17a and 17b and the second capacitor-forming electrode 18 may be arranged to define the inner electrodes. Also in this case, the variation in the electrostatic capacitance is minimized by making sure that the G'/G ratio is within the specific range described in the first preferred embodiment of the present invention.

Alternatively, as shown in FIGS. 9A to 9E, first and second capacitor-forming electrodes 7 and 8 may be located at various heights of the dielectric substrate 3. In an example shown in FIG. 9A, a first capacitor-forming electrode 7c is arranged to define an inner electrode at an intermediate height in the dielectric substrate 3, and an end portion of the first capacitor-forming electrode 7c is exposed in the vibration space 5. A second capacitor-forming electrode 8b is disposed on an inner surface of the concave section of the dielectric substrate 3 so as to define the surface the vibratory space 5.

Figure 9A:
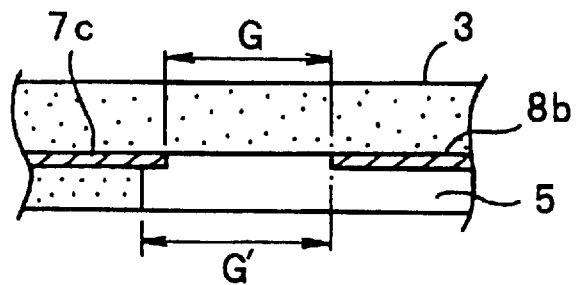
FIGS. 9A to 9E are partial cross-sectional views individually showing modified examples of the capacitor-containing piezoelectric resonance components according to the first preferred embodiment of the present invention.
Figure 9B:
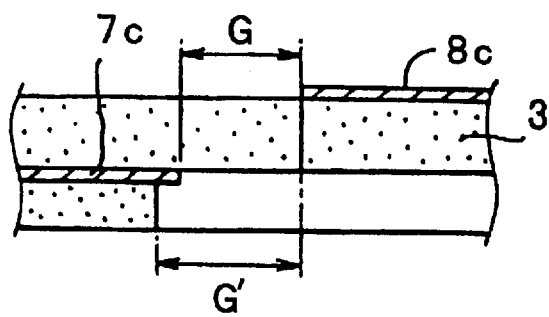
Figure 9C:
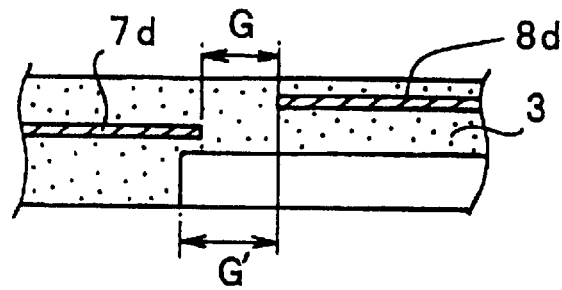
Figure 9D:
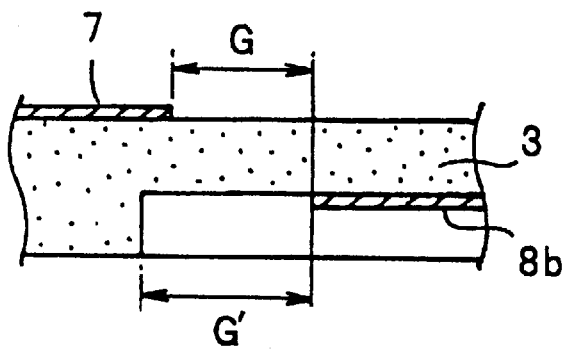
Figure 9E:
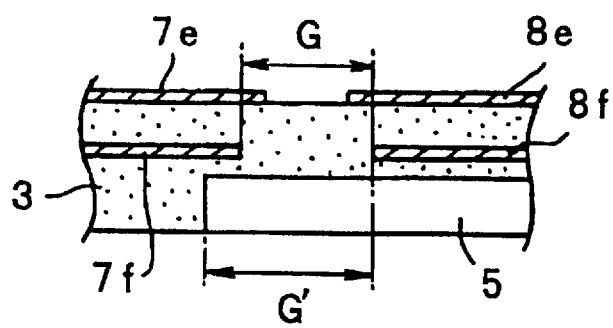

In an example shown in FIG. 9B, the configuration is the same as that in FIG. 9A except that a second capacitor-forming electrode 8c is provided on an upper surface portion of the dielectric substrate 3. Alternatively, as shown in FIG. 9C, either a first capacitor-forming electrode 7d or a second capacitor-forming electrode 8d may be an inner electrode disposed at different heights in the dielectric substrate 3. Also, as shown in FIG. 9D, a first capacitor-forming electrode 7 may be disposed on an upper surface of the dielectric substrate 3, and a second capacitor-forming electrode 8b may be disposed in a concave section of the dielectric substrate 3 so as to be exposed in the vibratory space 5. Furthermore, as shown in FIG. 9E, first capacitor-forming electrodes 7e and 7f may be overlaid via a dielectric substrate layer, and similarly, second capacitor-forming electrodes 8e and 8f may be overlaid via a dielectric substrate layer.

Figure 10A:
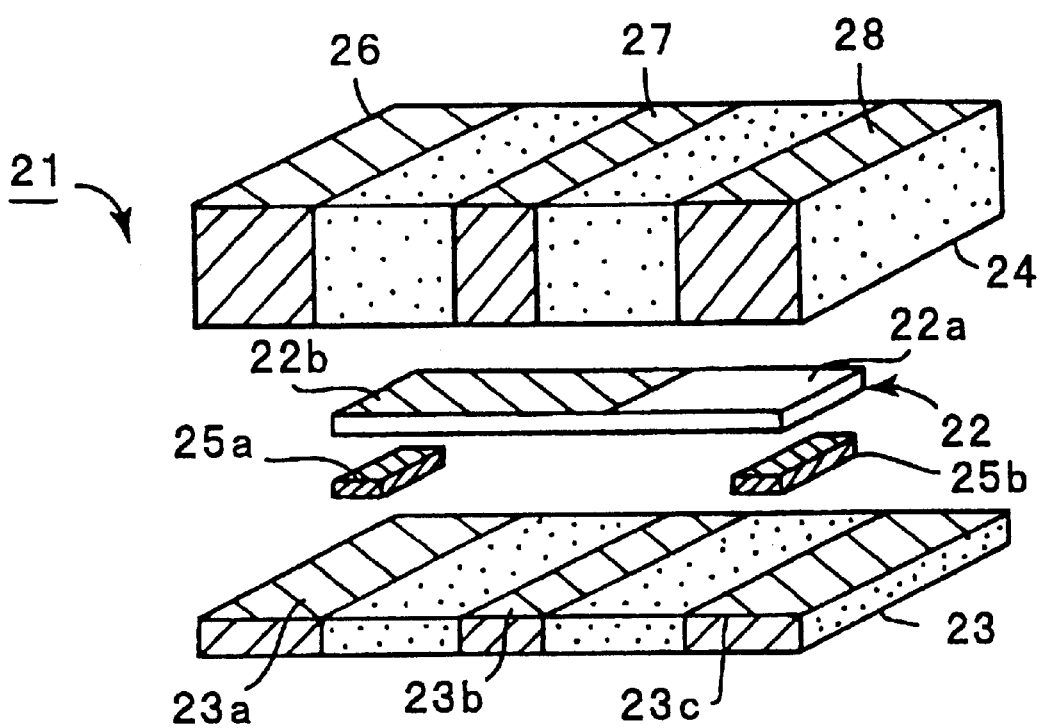
FIGS. 10A and 10B are, respectively, an exploded perspective view of a capacitor-containing piezoelectric resonance component according to a second preferred embodiment of the present invention and a perspective view showing the appearance of the second preferred embodiment of the present invention.
Figure 10B:
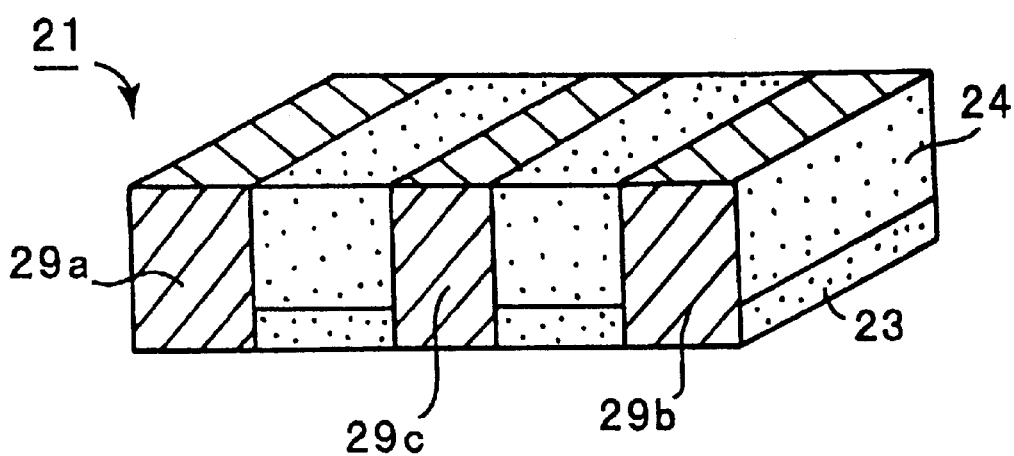
Figure 11:
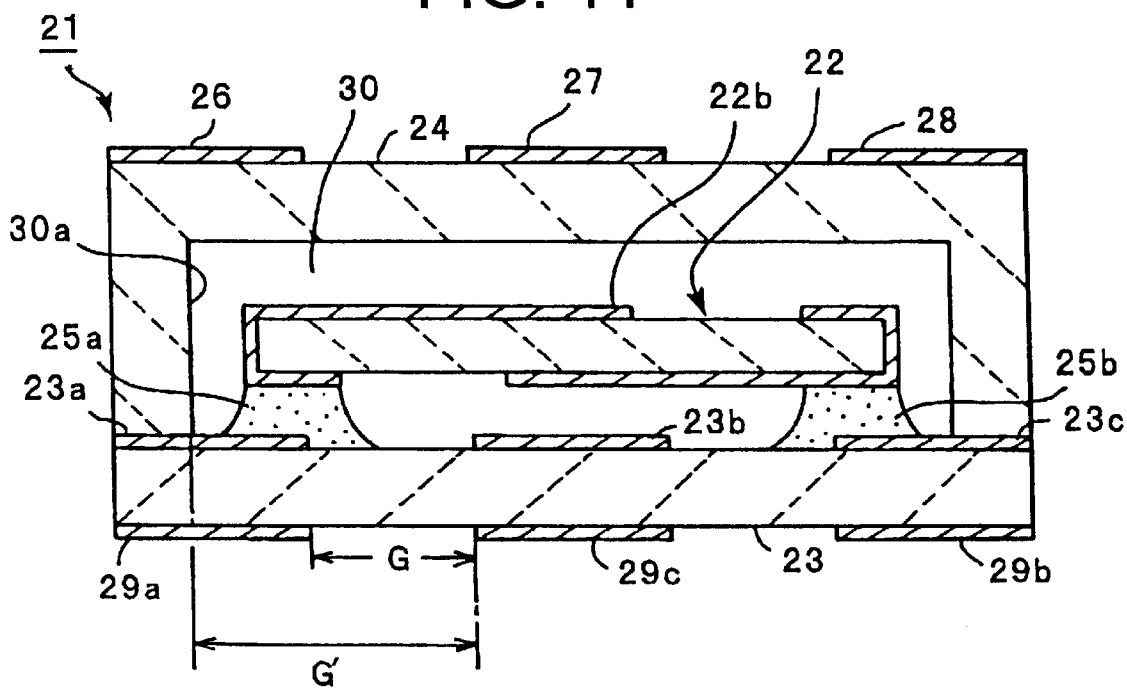
FIG. 11 is a vertical cross-sectional view of the capacitor-containing piezoelectric resonance component according to the second preferred embodiment of the present invention.

Referring to FIGS. 10A, 10B, and 11, a description will be given of a capacitor-containing piezoelectric resonance component 21 according to a second preferred embodiment of the present invention.

The capacitor-containing piezoelectric resonance component 21 of the second preferred embodiment has a package including a substantially rectangular casing substrate 23 that is preferably made of a dielectric material and a cap 24 that is also preferably made of a dielectric material and that has an opening facing downward. The package stores a piezoelectric resonance element 22.

The piezoelectric resonance element 22 is structured such that a resonance electrode 22b is disposed on an upper surface of a substantially rectangular piezoelectric plate 22a, and a resonance electrode is disposed on a lower surface so as to oppose the resonance electrode 22b via the piezoelectric plate 22a at the approximate center in the longitudinal direction. Since the piezoelectric plate 22a is polarized in the longitudinal direction, the piezoelectric resonance element 22 is an energy-trap type resonator that vibrates in the thickness-extensional sliding mode.

As a material for the casing substrate 23 and the cap 24, appropriate dielectric materials such as an alumina dielectric ceramic and resin may be selectively used. On the casing substrate 23, each of terminal electrodes 23a to 23c is arranged so as to wind about an upper-surface portion, a pair of side-surface portions, and a lower-surface portion thereof. The resonance electrode 22b of the piezoelectric resonance element 22 is electrically connected to the terminal electrode 23a via a conductive adhesive 25a. The other resonance electrode of the piezoelectric resonance element 2 is electrically connected to the terminal electrode 23c via a conductive adhesive 25b. Although it is not sufficiently clear in FIG. 10, as can be seen in FIG. 11, the resonance electrode 22b is arranged to longitudinally extend from an upper-surface of the piezoelectric plate 22a to a lower-surface portion via one side-surface portion thereof. Thereby, the lower section of the resonance electrode 22b is electrically connected to the conductive adhesive 25a.

The cap 24 has outer electrodes 26 to 28 arranged to extend over its upper-surface portions to a pair of its side-surface portions. The cap 24 is adhered to the casing substrate 23 by using an insulating adhesive (not shown).

In the second preferred embodiment, first capacitor-forming electrodes 29a and 29b and a second capacitor-forming electrode 29c are defined by the outer electrodes 26 to 28 and the terminal electrodes 23a to 23c. Specifically, as shown in FIG. 10B, the first capacitor-forming electrode 29a is defined by electrically connecting the outer electrode 26 and the terminal electrode 23a to each other. The other first capacitor-forming electrode 29b is defined by electrically connecting the outer electrode 28 and the terminal electrode 23c to each other. The second capacitor-forming electrode 29c is defined by connecting the outer electrode 27 and the terminal electrode 23b to each other.

As shown in FIG. 11, in the second preferred embodiment, the casing substrate 23 and the cap 24 are arranged to define a vibratory space 30 for allowing for free and unhindered vibration of the piezoelectric resonance element 22. Accordingly, similarly to the first preferred embodiment, in the case where the opposing distance between one of the first capacitor-forming electrodes 29a and 29b and the second capacitor-forming electrode 29c is represented by G, and the dimension (distance) along the aforementioned opposing direction between the end of the second capacitor-forming electrode 29c and an end portion 30a of the vibratory space 30 is represented by G', the following relationship is satisfied G'/G≧1. Thereby, the variation in the electrostatic capacitance is minimized.

Hereinbelow, a description will be given of a third preferred embodiment of the present invention.

Figure 12A:
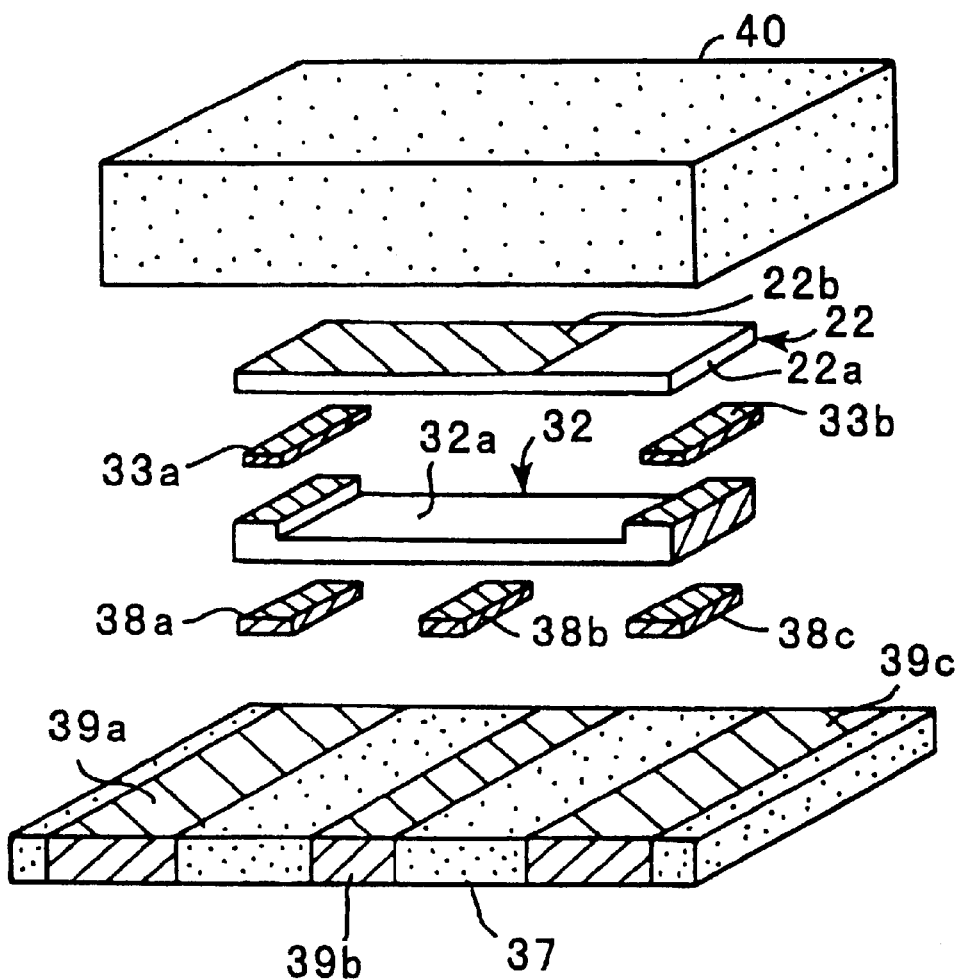
FIGS. 12A and 12B are, respectively, an exploded perspective view of a capacitor-containing piezoelectric resonance component according to a third preferred embodiment of the present invention and a perspective view showing the appearance of the third preferred embodiment of the present invention.
Figure 12B:
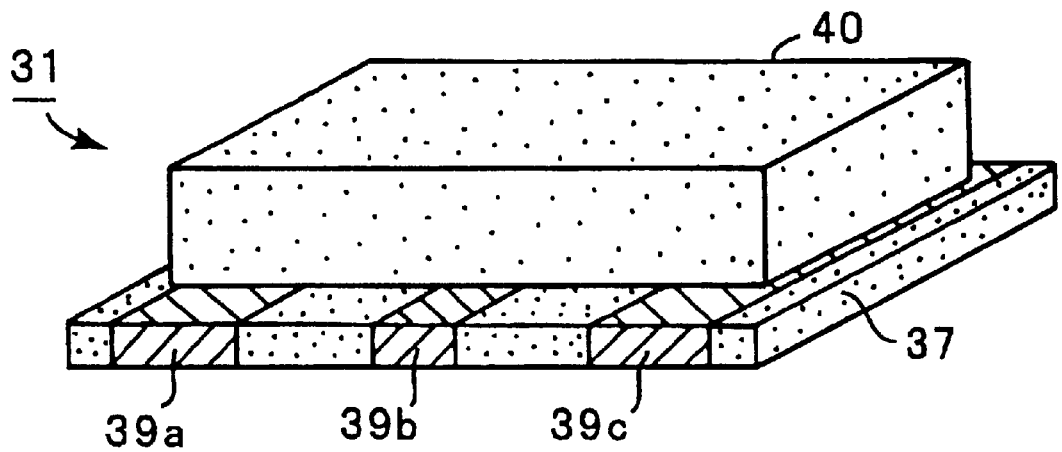

FIGS. 12A and 12B are, respectively, an exploded perspective view of a capacitor-containing piezoelectric resonance component 31 according to the third preferred embodiment and a perspective view showing the appearance thereof.

In the capacitor-containing piezoelectric resonance component 31, a piezoelectric resonance element 22 is disposed on a substantially rectangular dielectric substrate 32 via conductive adhesives 33a and 33b. The dielectric substrate 32 has a concave section 32a at the approximate center of its upper surface and is used to form capacitors.

Figure 13:
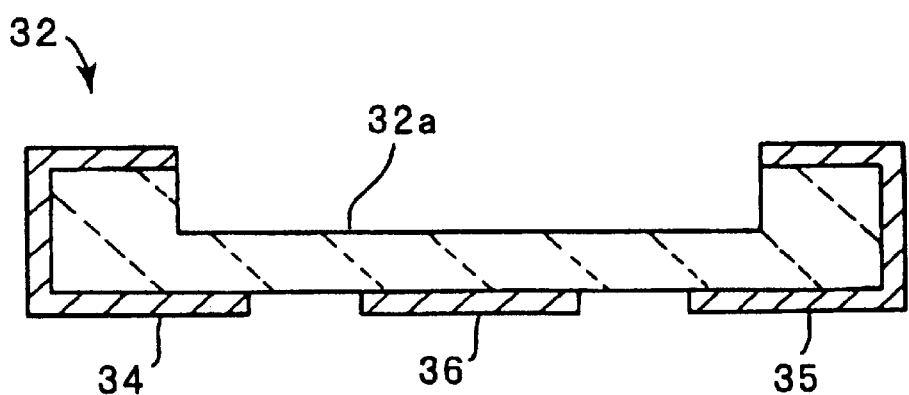
FIG. 13 is a vertical cross-sectional view of a dielectric substrate included in the third preferred embodiment of the present invention.

As shown in a cross-sectional view in FIG. 13, first capacitor-forming electrodes 34 and 35 are provided in opposing end portions of the dielectric substrate 32. One of the first capacitor-forming electrodes 34 and 35 is disposed at one of the end portions of the dielectric substrate 32 so as to extend from an upper-surface portion to a lower-surface portion through the side-surface portion. Similarly, the other first capacitor-forming electrode 35 is provided at the other side portion. A second capacitor-forming electrode 36 is disposed in the middle of the lower surface of the dielectric substrate 32. Thus, in the third preferred embodiment, capacitors are individually formed between the first and second capacitor-forming electrodes 34 and 36 and between the first and second capacitor-forming electrodes 35 and 36.

In a state where the piezoelectric resonance element 22 is overlaid, the concave section 32a of the dielectric substrate 32 defines a vibratory space for allowing for free and unhindered vibration of the piezoelectric resonance element 22.

The third preferred embodiment has a casing substrate 37 that is larger than the piezoelectric resonance element 22. A layered body formed by overlaying the dielectric substrate 32 and the piezoelectric resonance element 22 is adhered via conductive adhesives 38a to 38c to the casing substrate 37. Also, terminal electrodes 39a to 39c are provided on the casing substrate 37. The terminal electrodes 39a, 39b, and 39c are, respectively, electrically connected to the capacitor-forming electrodes 34, 36, and 35 via the conductive adhesives 38a, 38b, and 38c. An insulating cap 40 is fixed onto the casing substrate 37 via an insulating adhesive (not shown), thereby confining the piezoelectric resonance element 22 and the dielectric substrate 32.

Figure 14:
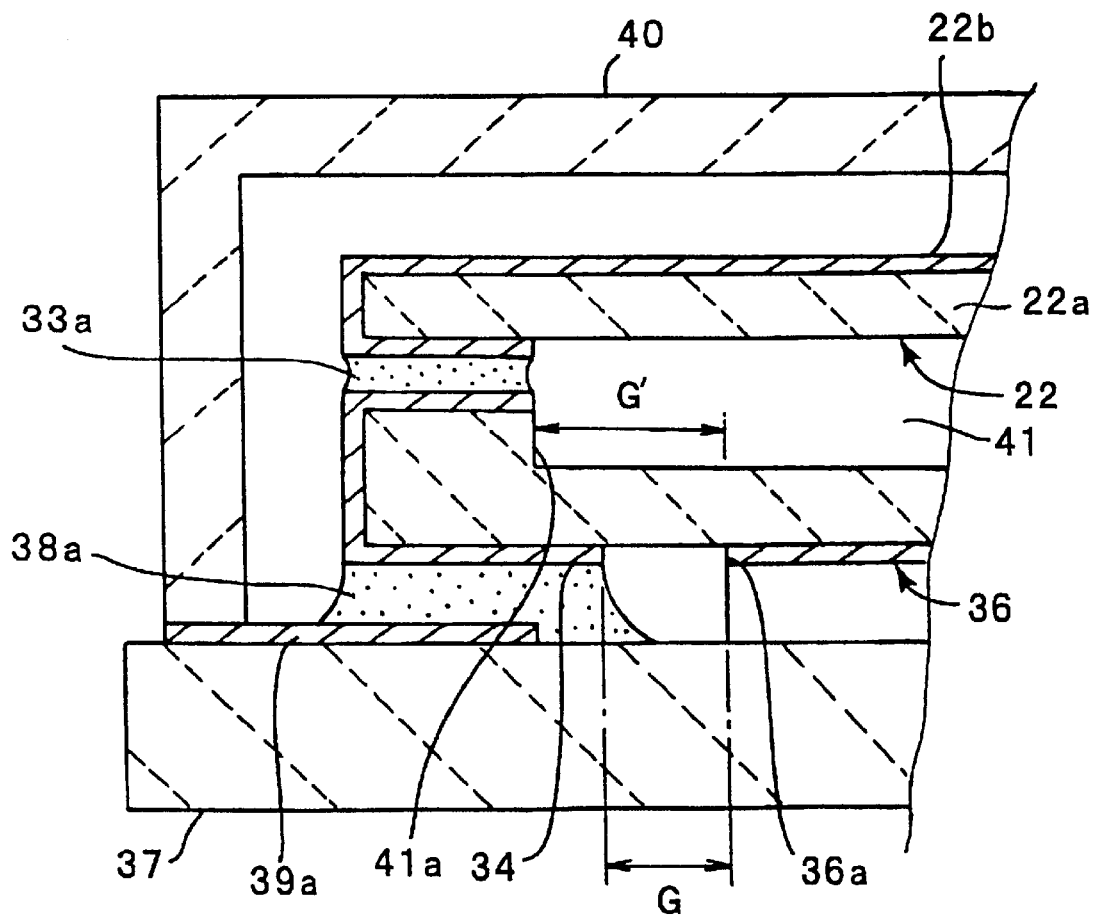
FIG. 14 is a partial cross-sectional view illustrating the relationship between a capacitor-forming electrode and a vibration space in the capacitor-containing piezoelectric resonance component of the third preferred embodiment of the present invention shown in FIG. 12.

Also in the described third preferred embodiment, as shown in a partial cross-sectional view in FIG. 14, when the dimension between an end portion 41a of a vibration space 41 and an end portion 36a of the second capacitor-forming electrode 36 is represented by G', and a gap between end portions of the first capacitor-forming electrodes 34 and the second capacitor-forming electrode 36 is represented by G, the ratio G'/G ratio has the same value as in the first preferred embodiment. Thereby, variations in the electrostatic capacitance are minimized.

For the dielectric substrate 32, the first and second capacitor-forming electrodes 34 to 36 are preferably provided on the lower surface. However, the configuration may be such as that shown in FIG. 15. In FIG. 15, first and second capacitor-forming electrodes 34a and 35a and a second capacitor-forming electrode 36a are individually located at an intermediate height in the dielectric substrate 32 to define inner electrodes. In this example, the second capacitor-forming electrode 36a is electrically connected via a through-hole electrode 41 to a connecting electrode 42 disposed on a lower-surface portion of the dielectric substrate 32.

Also, in this example, each of the first capacitor-forming electrodes 34a and 35a is led to each end of the dielectric substrate 32. Thereby, the first capacitor-forming electrodes 34a and 35a are electrically connected to respective outer electrodes 43 and 44 individually arranged so as to cover end-surface portions of the dielectric substrate 32 and to extend to the lower-surface portion thereof.

Hereinbelow, a description will be given of a fourth preferred embodiment of the present invention.

Figure 16A:
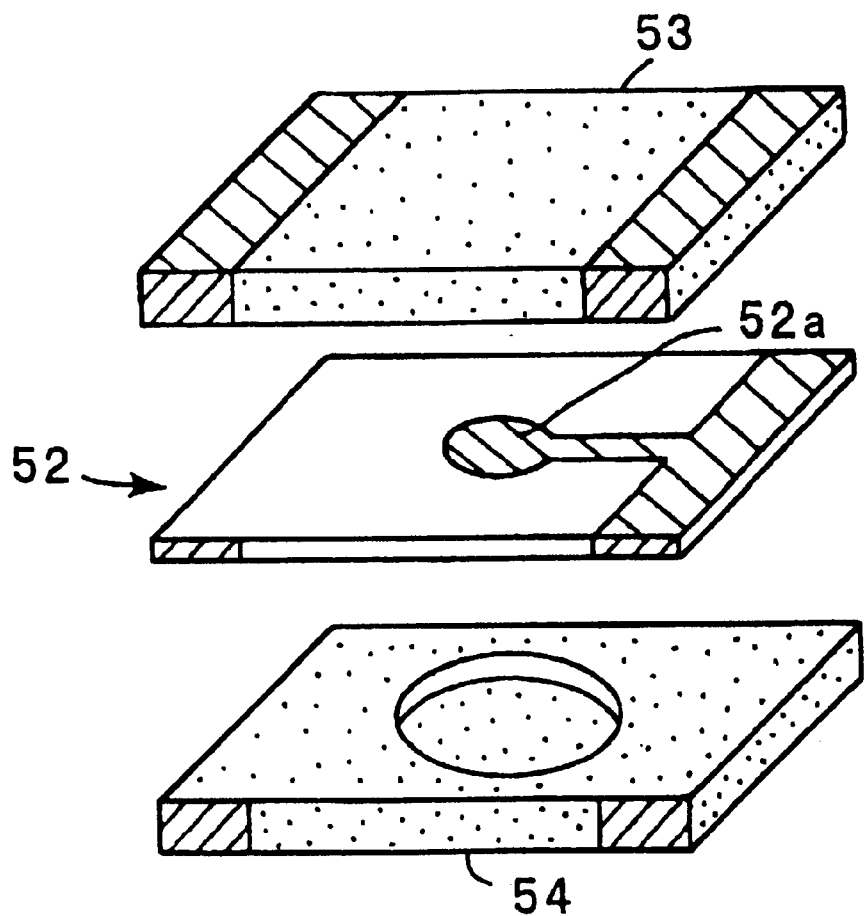
FIGS. 16A and 16B are, respectively, an exploded perspective view of a capacitor-containing piezoelectric resonance component according to a fourth preferred embodiment of the present invention and a perspective view showing the appearance of the fourth preferred embodiment of the present invention.
Figure 16B:
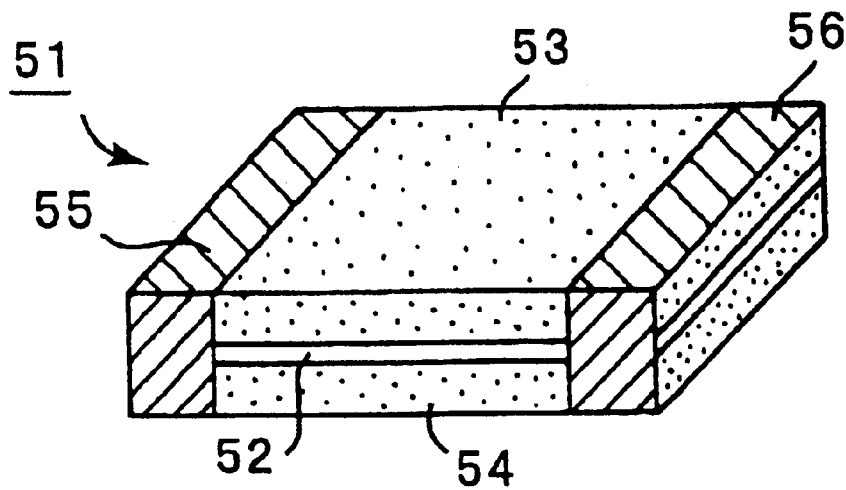

FIGS. 16A and 16B are, respectively, an exploded perspective view of a capacitor-containing piezoelectric resonance component 51 of the fourth preferred embodiment and a perspective view showing the appearance thereof.

In the capacitor-containing piezoelectric resonance component 51, dielectric substrates 53 and 54 are, respectively, overlaid on the upper surface and the lower surface of a piezoelectric resonance element 52 via insulating adhesives (not shown). The piezoelectric resonance element 52 is an energy-trap type that vibrates in the thickness-vertical vibration mode.

As shown in FIG. 16B, in the capacitor-containing piezoelectric resonance component 51, first and second capacitor-forming electrodes 55 and 56 are located at both end portions of a layered body. Each of the first and second capacitor-forming electrodes 55 and 56 is arranged so as to wind about an upper-surface portion, a pair of side-surface portions, and a lower-surface portion of the layered body. The second capacitor-forming electrode 56 is electrically connected to a resonance electrode 52a shown in FIG. 16A. A resonance electrode (not shown) disposed on a lower-surface portion of the piezoelectric resonance element 52 is electrically connected to the first capacitor-forming electrode 55.

Thus, piezoelectric resonators and capacitors are connected in parallel between the first and second capacitor-forming electrodes 55 and 56. In addition, the first and second capacitor-forming electrodes 55 and 56 also function as terminal electrodes that allow electrical connection to external components.

Figure 17:
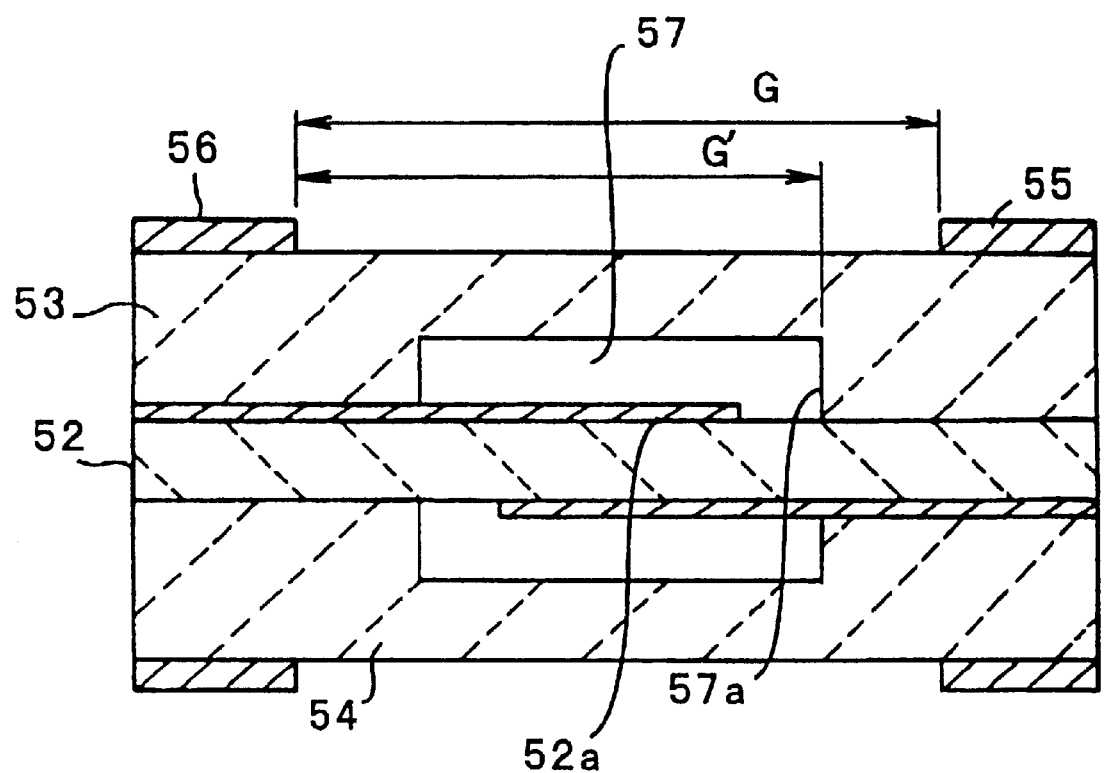
FIG. 17 is a vertical cross-sectional view of the capacitor-containing piezoelectric resonance component shown in FIGS. 16A and 16B.

Also in the fourth preferred embodiment, as shown in FIG. 17, the first and second capacitor-forming electrodes 55 and 56 oppose each other via a gap G. Therefore, in a case where G' represents the dimension along the direction in which an end portion of the second capacitor-forming electrode 56 and an end portion 57a of a vibration space 57, the configuration is made so as to have a G'/G ratio that is within the above-described specific range. Thereby, the variations in the electrostatic capacitance are minimized.

Hereinbelow, a description will be given of a fifth preferred embodiment of the present invention.

Figure 18A:
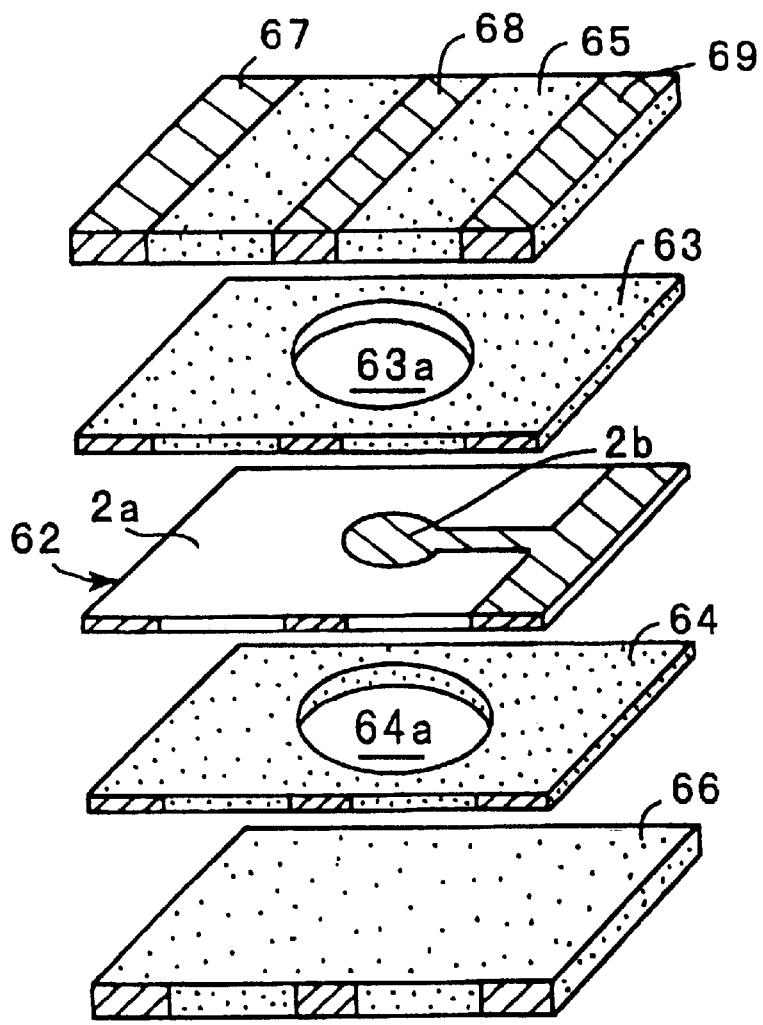
FIGS. 18A and 18B are, respectively, an exploded perspective view of a capacitor-containing piezoelectric resonance component according to a fifth preferred embodiment and a perspective view showing the appearance of the fifth preferred embodiment of the present invention.
Figure 18B:
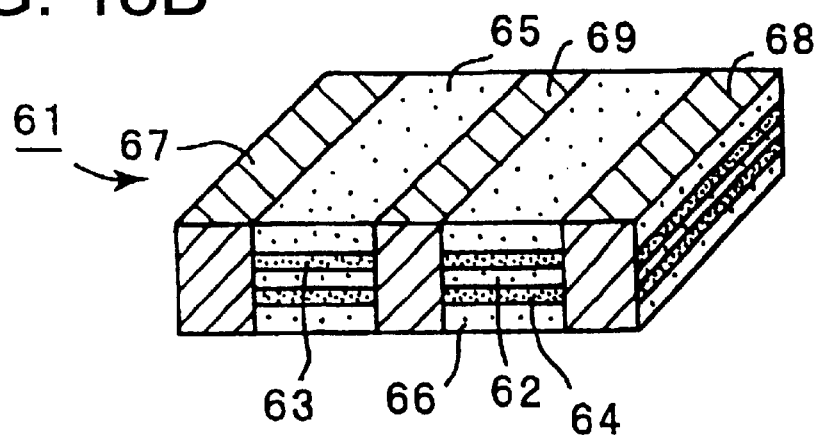

FIGS. 18A and 18B are, respectively, an exploded perspective view of a capacitor-containing piezoelectric resonance component 61 according to the fifth preferred embodiment and a perspective view showing the appearance thereof.

In the capacitor-containing piezoelectric resonance component 61, dielectric substrates 65 and 66 are, respectively, overlaid on the upper surface and the lower surface of a piezoelectric resonance element 62 via dielectric layers 63 and 64. The dielectric layer 63 has an opening 63a and the dielectric layer 64 has an opening 64a. The dielectric layers 63 and 64 are arranged to define a vibrating space that allows for free and unhindered vibration of the energy-trap vibrating section.

The piezoelectric resonance element 62 has a configuration similar to the piezoelectric resonance element 2 of the capacitor-containing piezoelectric resonance component 1 according to the first preferred embodiment. The dielectric layers 63 and 64 are preferably made of an appropriate dielectric material, for example, resin or an insulating ceramic.

The piezoelectric resonance element 62, the dielectric layer 63, the dielectric layer 64, the dielectric substrate 65, and dielectric substrate 66 are adhered to each other by using adhesives (not shown) and are thereby overlaid. Also, first capacitor-forming electrodes 67 and 68 and a second capacitor-forming electrode 69 are provided on an outer surface of the capacitor-containing piezoelectric resonance component 61. Each of the capacitor-forming electrodes 67 to 69 is arranged so as to wind about an upper-surface portion, a pair of side-surface portions, and a lower-surface portion.

Figure 19:
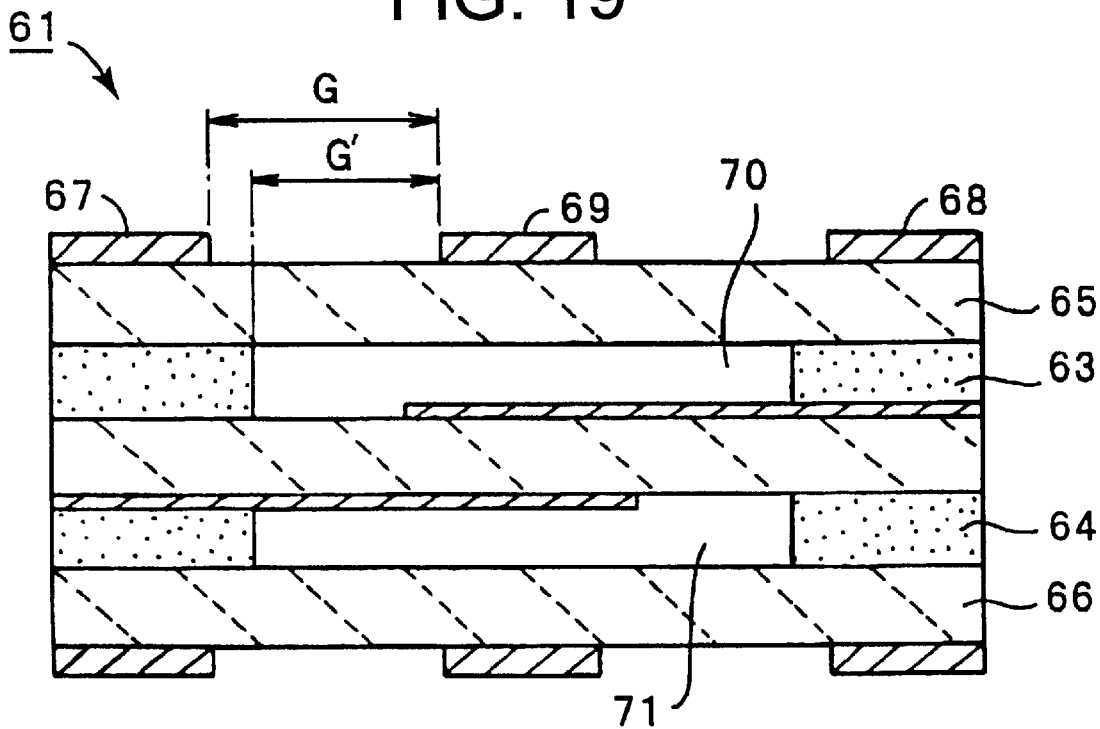
FIG. 19 is a vertical cross-sectional view of the capacitor-containing piezoelectric resonance component shown in FIGS. 18A and 18B.

As shown in FIG. 19, the opening 63a of the dielectric layer 63 defines a vibratory space 70 and the opening 64a defines a vibratory space 71. Also in this preferred embodiment, as shown in FIG. 19, the distance by which the first capacitor-forming electrode 67 and the second capacitor-forming electrode 69 oppose each other is represented by G, and the distance along the direction in which an end portion of the vibratory space 70 and an end portion of the second capacitor-forming electrode 69 oppose each other is represented by G'.

In the fifth preferred embodiment, the relative permittivity of the dielectric material forming the casing substrates 65 and 66 (dielectric substrates) is represented by $\epsilon_1$, and the relative permittivity of the dielectric material forming the dielectric layers 63 and 64 is represented by $\epsilon_2$. When the configuration is made so as to satisfy $\epsilon_2/\epsilon_1 \leq 0.063$, the variation in the electrostatic capacitance can thereby be reduced regardless of the ratio G'/G.

Hereinbelow, a detailed description will be given regarding the above with reference to FIGS. 20, 21, 22A to 22C, 23, and 24.

Figure 20:
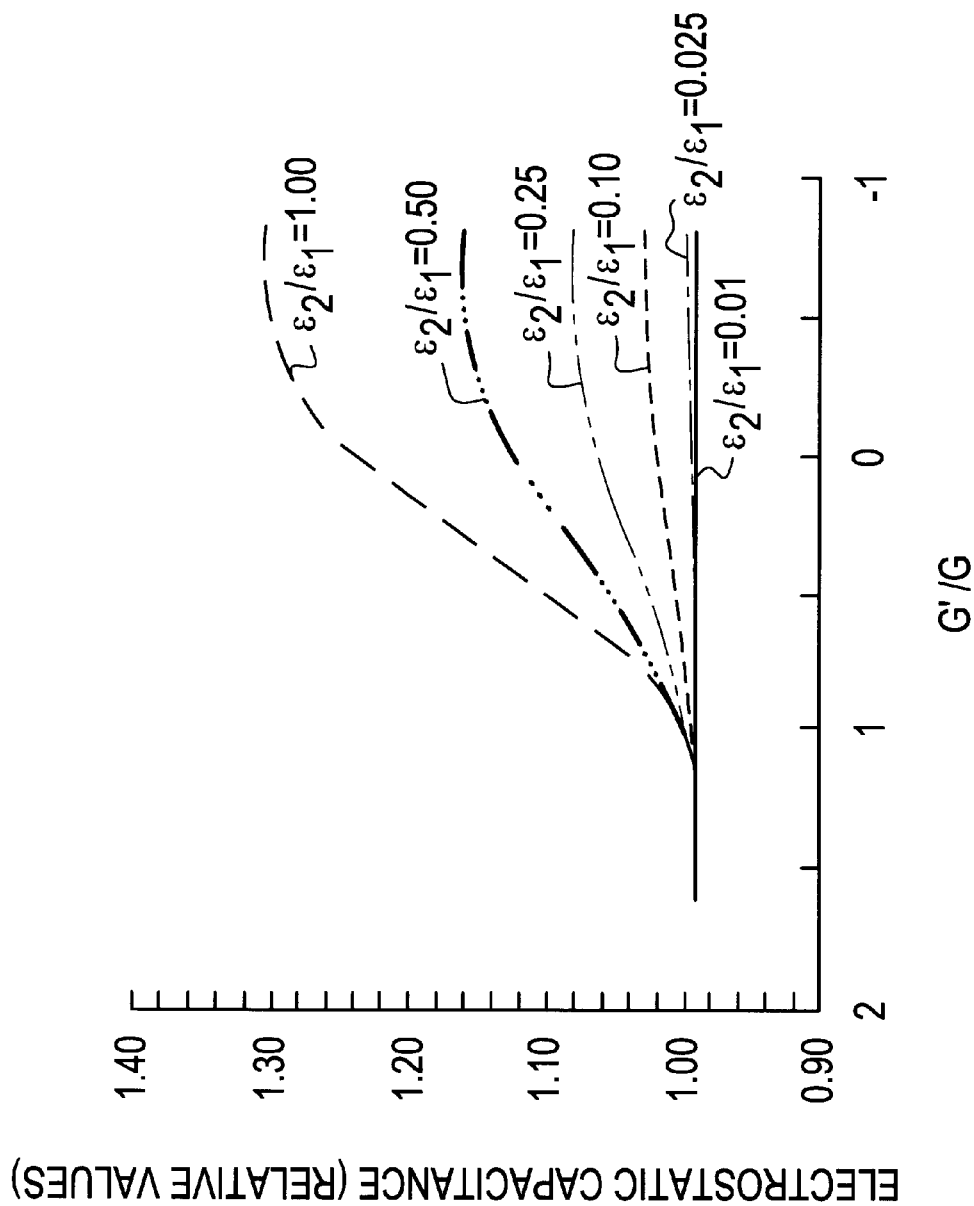
FIG. 20 is a graph showing the relationships between the ratio of G'/G and electrostatic capacitance in the capacitor-containing piezoelectric resonance component according to the fifth preferred embodiment of the present invention.

The inventors changed the ratio $\epsilon_2/\epsilon_1$ and the ratio G'/G in the capacitor-containing piezoelectric resonance component 61 and evaluated the electrostatic capacitance obtained therein. The results are shown in FIG. 20. In FIG. 20, the horizontal axis represents the G'/G ratios, and the vertical axis represents the electrostatic capacitance (relative value). The electrostatic capacitance (relative value) indicates the ratio relative to the electrostatic capacitance value of 1.00 assumed in a case where G'/G=1.00, and $\epsilon_2/\epsilon_1$=1.00. For the piezoelectric resonance element 62, the same piezoelectric resonance element that produced the results shown in FIG. 6 was used. For the dielectric substrates 65 and 66, a substantially rectangular substrate member having approximate dimensions of 2.5 mm×2.0 mm×0.30 mm (thickness) and formed of a titanate-strontium-based ceramic was used. Each of the dielectric layers 63 and 64 had approximate dimensions of 2.5 mm×2.0 mm×0.05 mm, and an epoxy-based resin was used as a material therefor.

As can easily seen from FIG. 20, the electrostatic capacitance is also stable in regions other than that in the case where $\epsilon_2/\epsilon_1$=1.0. Based on this, for various $\epsilon_2/\epsilon_1$ ratios, ratios of G'/G that produce limit values in the areas where the electrostatic capacitance is stable were selected and were checked for the relationship to the $\epsilon_2/\epsilon_1$ ratios. The results are summarized in FIG. 21.

In FIG. 21, the diagonally hatched area represents an electrostatic-capacitance stable region. This indicates that, as logarithmic functions, the $\epsilon_2/\epsilon_1$ ratio (=Y) and the G'/G ratio can be approximately close to each other. Also, in a case where $\epsilon_2/\epsilon_1$=0.063, approximate line curves C and D overlap with each other. This shows that, in a case where $\epsilon_2/\epsilon_1 \leq 0.063$, the variation in the G'/G ratio has almost no influence on the electrostatic capacitance.

Thus, in the capacitor-containing piezoelectric resonance component 61 that has the configuration in which the dielectric layers 63 and 64 are, respectively, overlaid on the dielectric substrates 65 and 66, whatever the variation in the G'/G ratio is, making the configuration which satisfies $\epsilon_2/\epsilon_1 = \leq 0.063$ allows high-precision electrostatic capacitors to be formed between each of the first capacitor-forming electrodes 67 and 68 and the second capacitor-forming electrode 69.

In this configuration, for the dielectric layers 63 and 64, an integral unit may be prepared by integral-baking processing. Alternatively, separate members for the dielectric layers 63 and 64 may be adhered to the dielectric substrates 65 and 66, respectively.

Figure 22A:
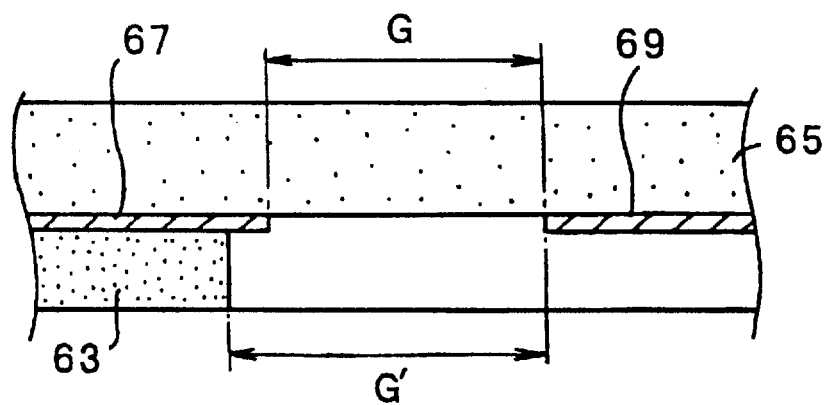
FIGS. 22A to 22C are partial cross-sectional views of modified examples of the capacitor-containing piezoelectric resonance component according to the fifth preferred embodiment of the present invention.
Figure 22B:
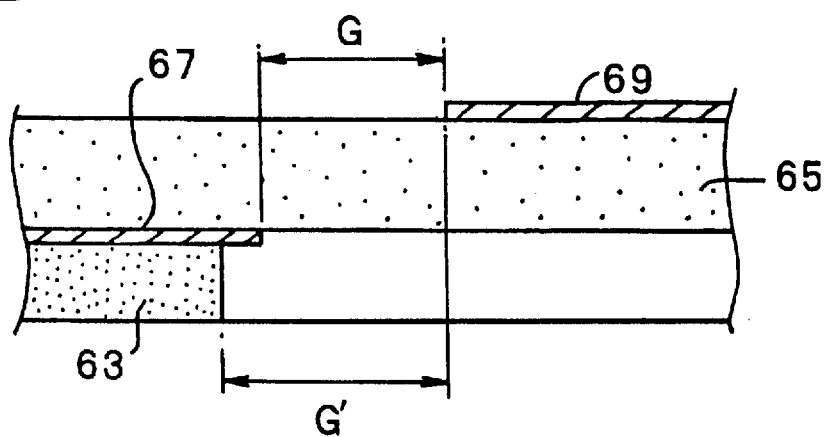
Figure 22C:
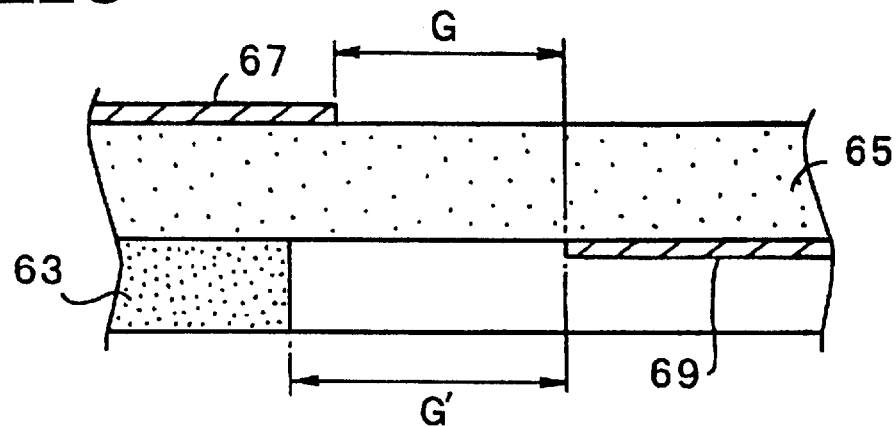

In the fifth preferred embodiment shown in FIG. 18, the capacitor-forming electrodes 67, 68, and 69 are provided on the outer surface of the capacitor-containing piezoelectric resonance component 61. However, as shown in FIGS. 22A to 22C, they may be formed in different ways. For example, the first capacitor-forming electrodes 67 and 68 may be located on lower-surface portions of the casing substrate 65 (dielectric substrate). Alternatively, at least one of the first capacitor-forming electrodes 67 and 68 may be located on either an upper-surface portion or a lower-surface portion of the casing substrate 65. Alternatively, at least one of the capacitor-forming electrodes 67, 68, and 69 may be an inner electrode formed either in the dielectric layer 63 and/or dielectric layer 64. Alternatively, at least one of the capacitor-forming electrodes 67, 68, and 69 may be an inner electrode disposed at an intermediate height in the dielectric substrate 65 and/or the dielectric substrate 66.

Figure 23:
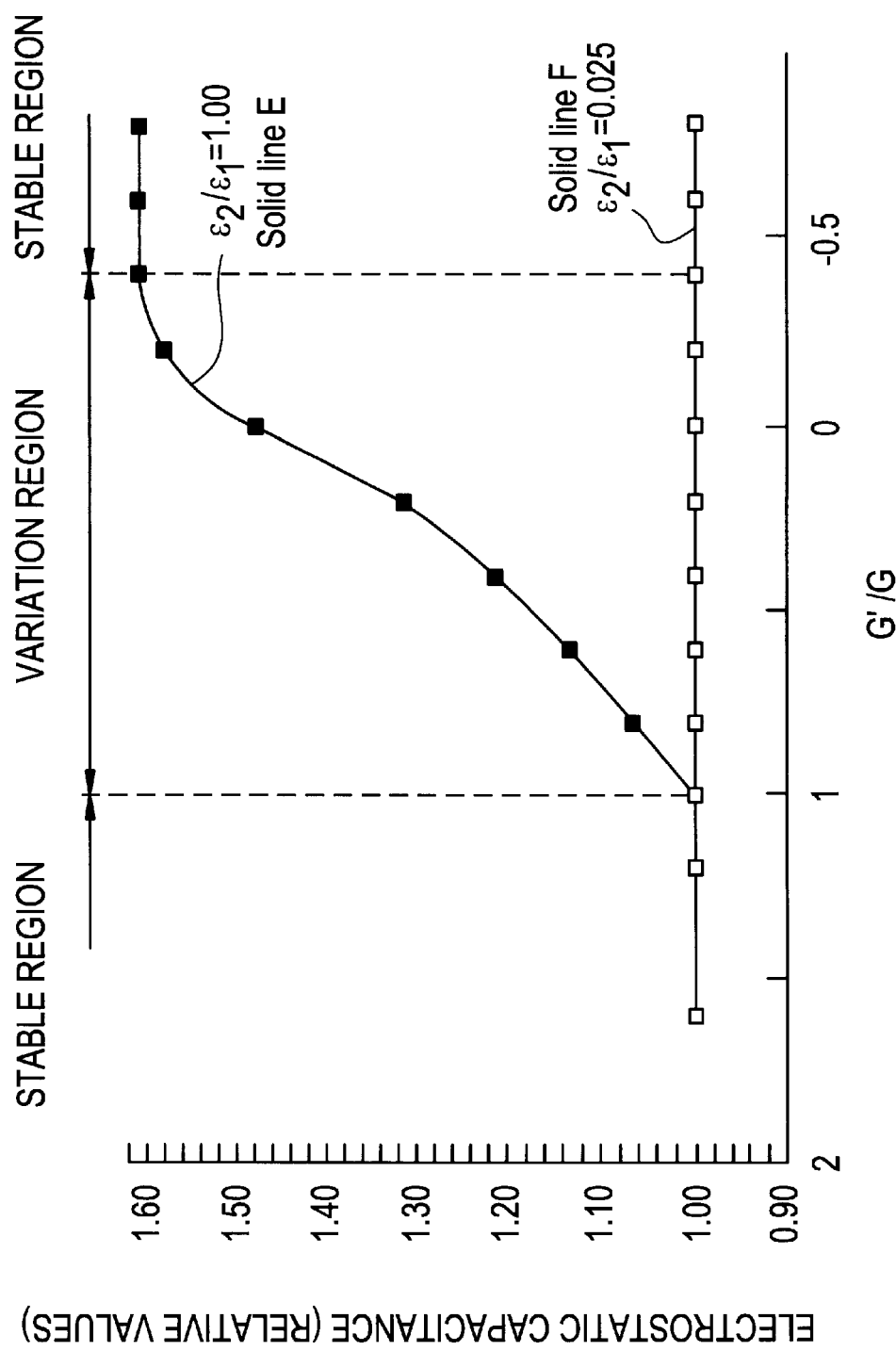
FIG. 23 is a graph showing the relationships between the ratio G'/G and electrostatic capacitance in a case where capacitor-forming electrodes are formed as shown in FIG. 22A in the capacitor-containing piezoelectric resonance component of the fifth preferred embodiment of the present invention.
Figure 24:
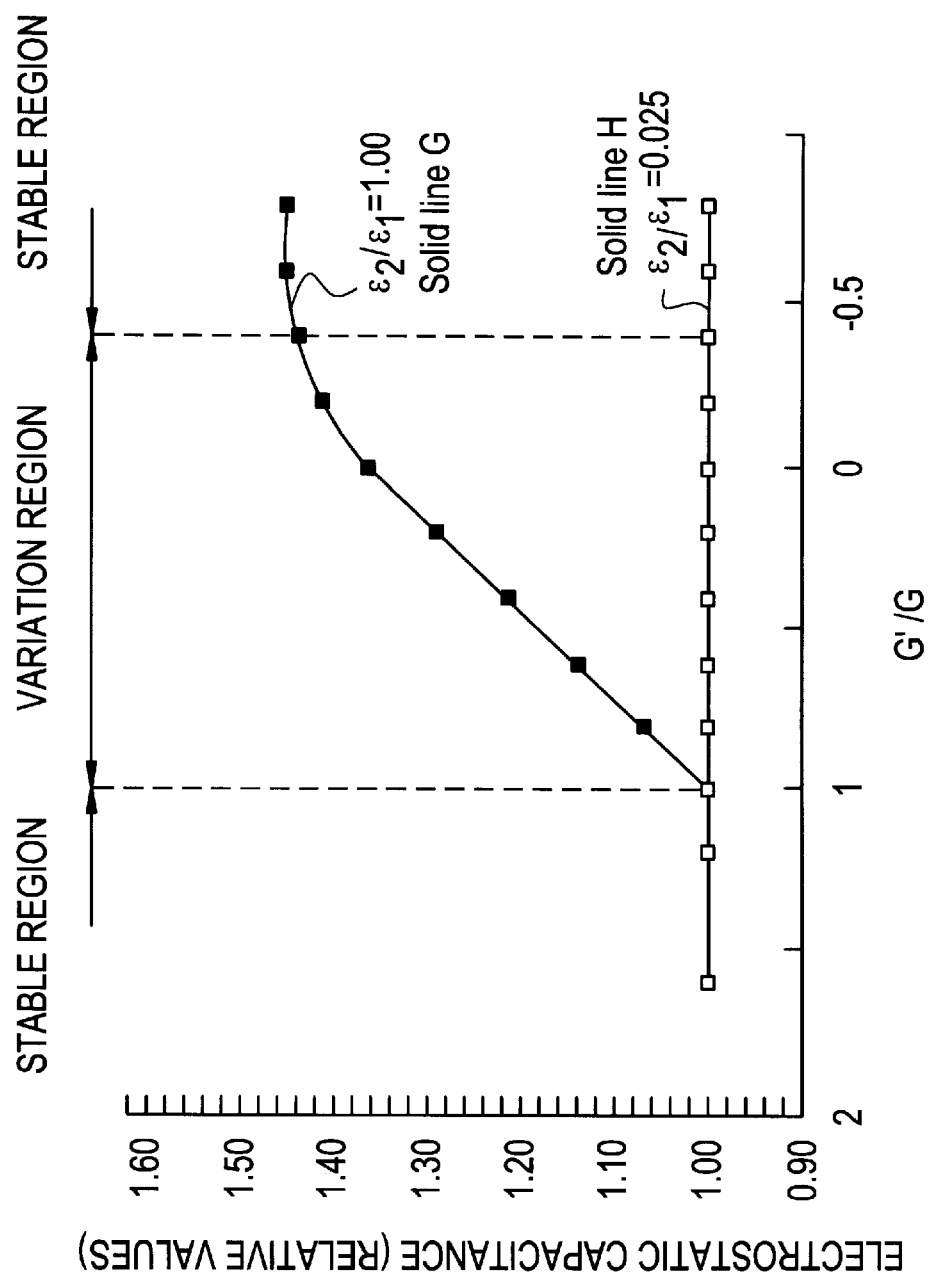
FIG. 24 is a graph showing the relationship between the ratio G'/G and electrostatic capacitance in a case where the capacitor-forming electrodes are formed as shown in FIG. 22B in the capacitor-containing piezoelectric resonance component of the fifth preferred embodiment of the present invention.
Figure 25:
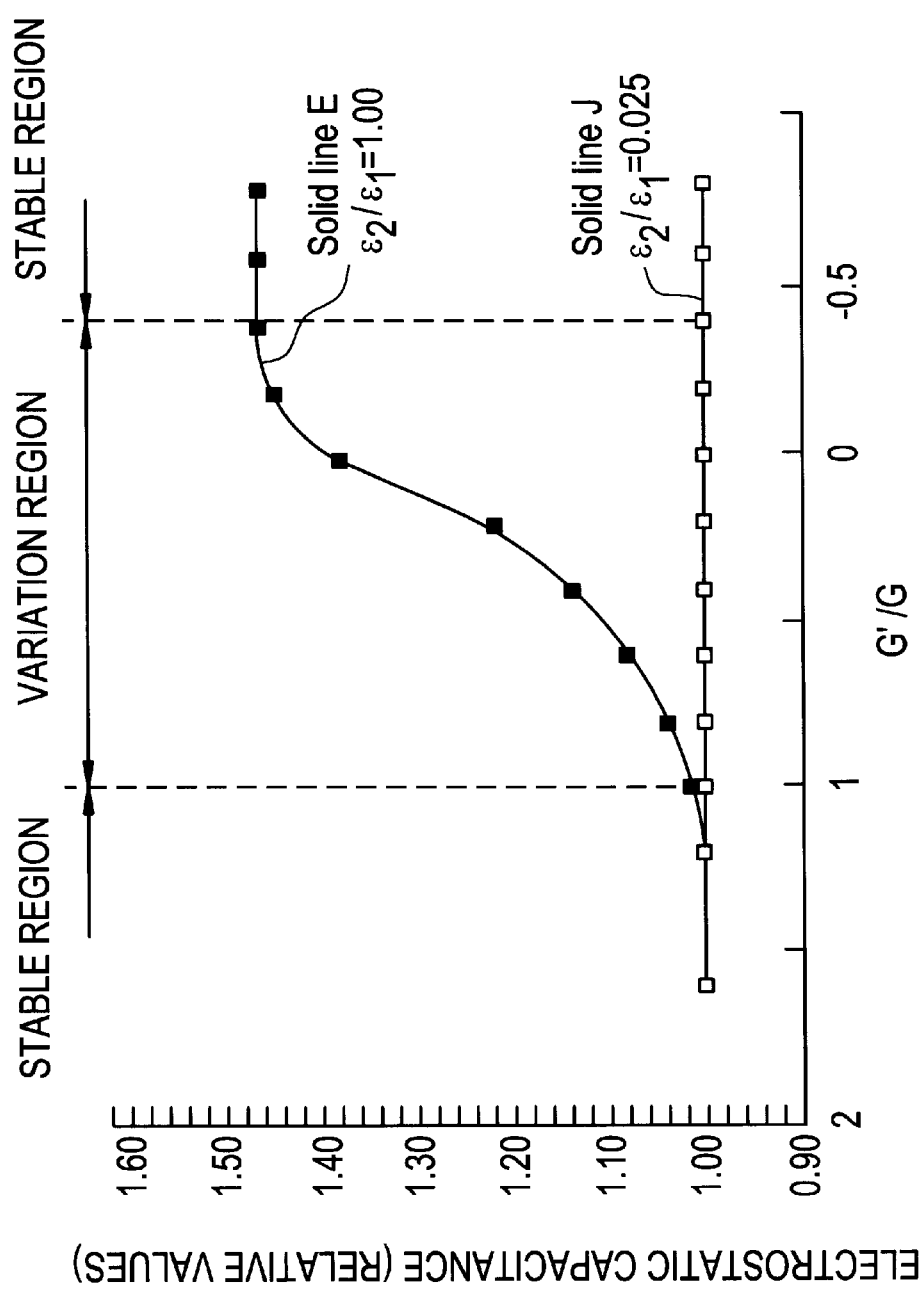
FIG. 25 is a graph showing the relationships between the ratio G'/G and electrostatic capacitance in a case where the capacitor-forming electrodes are formed as shown in FIG. 22C in the capacitor-containing piezoelectric resonance component of the fifth preferred embodiment of the present invention.

FIGS. 23 to 25 shows relationships between the G'/G ratio in cases where the capacitor-forming electrodes are arranged as shown in FIGS. 22A to 22C in the described capacitor-containing piezoelectric resonance component 61 and the electrostatic capacitance that can be obtained therein. For example, FIG. 23 shows the relationships between the G'/G ratio in the case the capacitor-forming electrodes are arranged as shown in FIG. 22A and electrostatic-capacitance value. In the figure, a solid line E indicates the relationship in the case where $\epsilon_2/\epsilon_1 = 1.00$, and a solid line F indicates the relationship in the case where $\epsilon_2/\epsilon_1 = 0.025$. Similarly, in FIGS. 24 and 25, solid lines G and I and solid lines H and J indicate the relationships in the cases where $\epsilon_2/\epsilon_1 = 1.00$ and $\epsilon_2/\epsilon_1 = 0.025$, respectively.

As is apparent from FIGS. 23 to 25, depending on the type of arrangement for the capacitor-forming electrodes 67 to 69, the magnitude of variation in an electrostatic-capacitance variation region somewhat varies. However, almost no variation occurs at G'/G ratios that represent thresholds between electrostatic-capacitance stable regions and the electrostatic-capacitance variation region.

FIG. 21 indicates that, in a case where $1 \leq \epsilon_2/\epsilon_1 \leq 0.063$, it is preferable that the configuration be made so as to satisfy one of expressions $G'/G \geq 0.2183\log(\epsilon_2/\epsilon_1)+1.0682$ and $G'/G \leq -0.3756\log(\epsilon_2/\epsilon_1)-0.5734$. The preferable configuration produces electrostatic capacitors having much higher precision.

As described above, the capacitor-containing piezoelectric resonance component 61 of the fifth preferred embodiment has the overlaid structure in which the dielectric substrates 65 and 66 are overlaid on the plate-like piezoelectric resonance element 62 via the dielectric layers 63 and 64. However, the structure of the capacitor-containing piezoelectric resonance component according to various preferred embodiments of the present invention is not restricted to the overlaid type.

FIGS. 26 to 31 show modified examples of the piezoelectric resonance component according to the fifth preferred embodiment.

Figure 26:
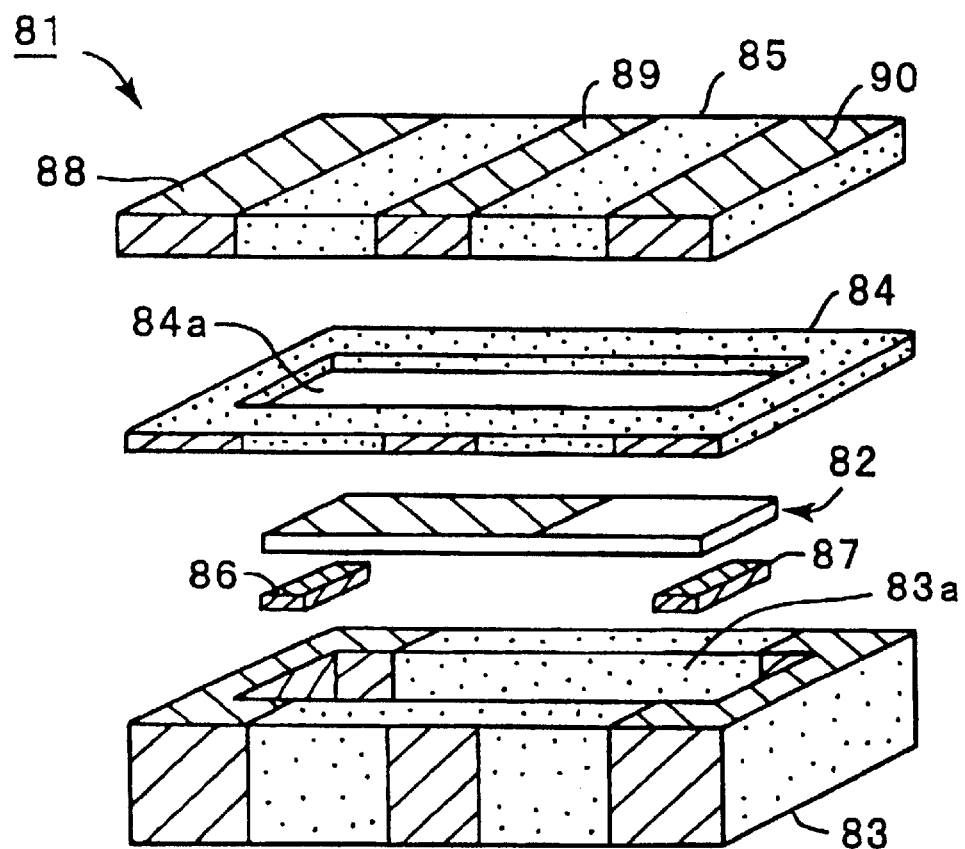
FIG. 26 is an exploded view showing a modified example of the capacitor-containing piezoelectric resonance component according to the fifth preferred embodiment of the present invention.

In a chip-type piezoelectric resonance component 81 shown in FIG. 26, an energy-trap piezoelectric resonance element 82 using the thickness-extensional sliding mode is stored in a package. The package preferably includes a casing member 83 that has an opening 83a facing upward, a frame-like dielectric layer 84 having an opening 84a, and a dielectric substrate 85. The piezoelectric resonance element 82 is adhered to the casing member 83 via conductive adhesives 86 and 87, and also, is electrically connected to terminal electrodes. In an assembled state of the package, first capacitor-forming electrodes 88 and 90 and a second capacitor-forming electrode 89 are disposed on the outer surface of the piezoelectric resonance component 81.

Figure 27:
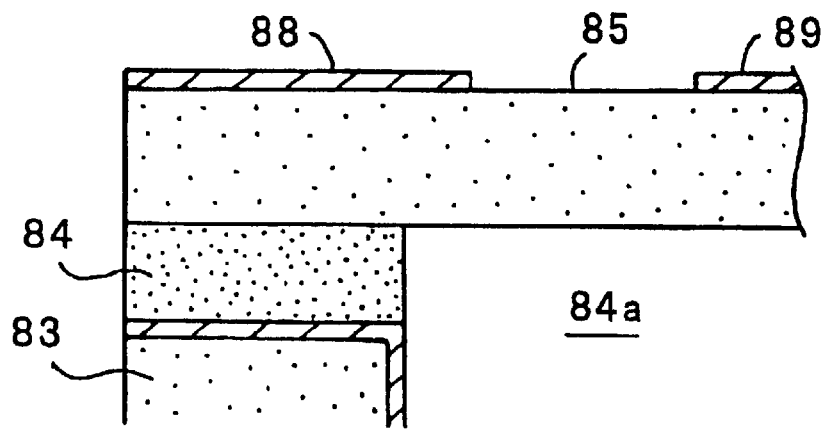
FIG. 27 is a partial cross-sectional view of important portions in the capacitor-containing piezoelectric resonance component shown in FIG. 26.

Also in the modified configuration, similarly to the fifth preferred embodiment, control of the $\epsilon_2/\epsilon_1$ ratio allows high-precision capacitors to be formed between the first and second capacitor-forming electrodes 88 and 89 and between the second and first capacitor-forming electrodes 89 and 90. As shown in FIG. 27, a vibration space is formed by the opening 84a of the dielectric layer 84. In this configuration, when $\epsilon_1$ represents the relative permittivity of the dielectric material that defines the dielectric layer 84 and $\epsilon_2$ represents the relative permittivity of the dielectric material that defines the dielectric substrate 85, the $\epsilon_2/\epsilon_1$ ratio is controlled as in the case of the fifth preferred embodiment. Thereby, the variation in the electrostatic capacitance is effectively minimized.

Figure 28:
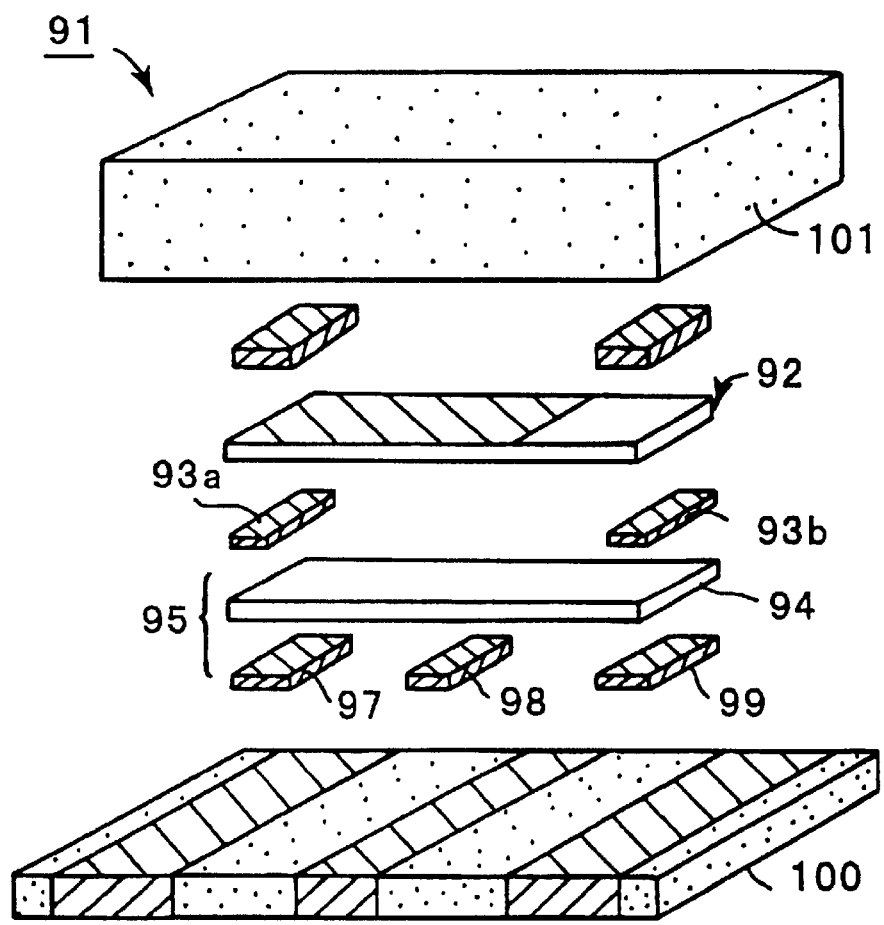
FIG. 28 is an exploded perspective view of another modified example of the capacitor-containing piezoelectric resonance component according to the fifth preferred embodiment of the present invention.
Figure 29:
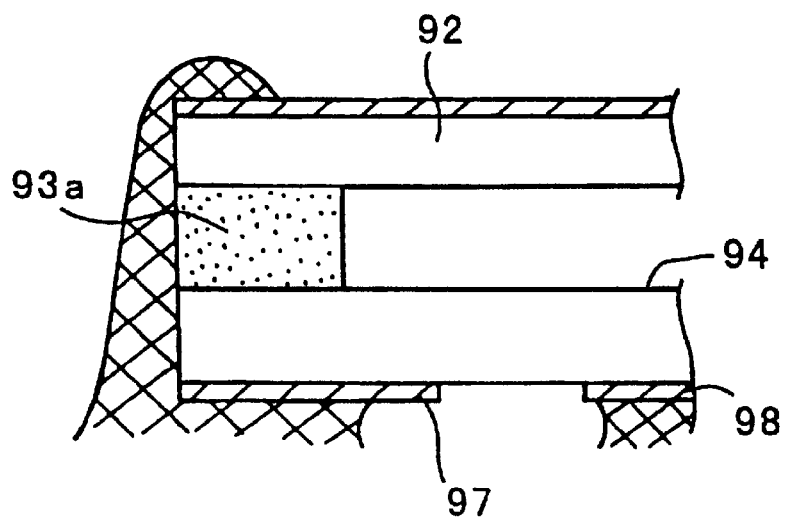
FIG. 29 is a partial cross-sectional view of important portions in the capacitor-containing piezoelectric resonance component shown in FIG. 28.

Similarly, in a chip-type piezoelectric resonance component 91 shown in FIG. 28, an energy-trap piezoelectric resonance element 92 using the thickness-extensional sliding mode is provided, and a capacitor element 95 having a dielectric substrate 94 is overlaid on the resonance electrode 92 via conductive adhesives 93a and 93b. In the figure, 100 denotes a casing substrate, and 101 denotes a cap.

A space for allowing for free and unhindered vibration of the piezoelectric resonance element 92 is defined by a space between the conductive adhesives 93a and 93b. Accordingly, by making the configuration to have dimensions G and G' shown in FIG. 29 that are arranged so as to have G'/G ratios within the same range as in the case of the first preferred embodiment, the variation in the electrostatic capacitance is minimized. Capacitor-forming electrodes 97 to 99 are preferably provided on lower-surface portions of the dielectric substrate 94.

Figure 30:
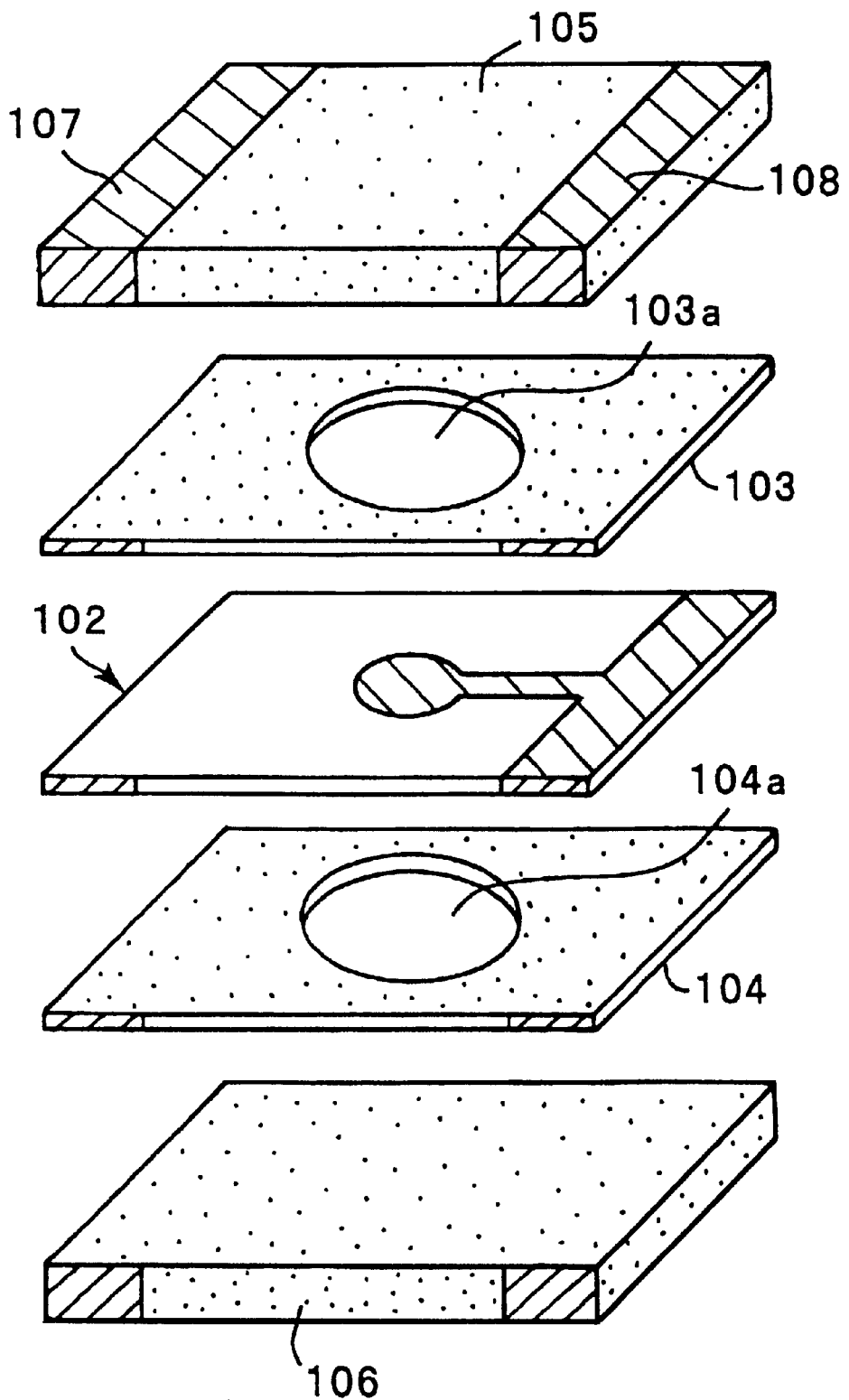
FIG. 30 is an exploded perspective view of a modified example of the capacitor-containing piezoelectric resonance component according to another preferred embodiment of the present invention.

In the above first to fifth preferred embodiments, the description has been given referring to three-terminal-type capacitor-containing piezoelectric resonance components. However, the present invention may also be applied to a two-terminal-type capacitor-containing piezoelectric resonance component. FIG. 30 is an exploded perspective view of an example two-terminal capacitor-containing piezoelectric resonance component. The two-terminal-type capacitor-containing piezoelectric resonance component has a plate-like energy-trap piezoelectric resonance element 102. On an upper surface portion and a lower-surface portion of the piezoelectric resonance element 102, respectively, dielectric substrates 105 and 106 are overlaid via frame-like dielectric layers 103 and 104. The dielectric layers 103 and 104 have openings 103a and 104a, respectively. A capacitor is defined between capacitor-forming electrodes 107 and 108. At least one of the G'/G ratio according to the first preferred embodiment or the $\epsilon_2/\epsilon_1$ ratio according to the fifth embodiment is satisfied. Therefore, the aforementioned electrostatic capacitor has very high precision.

Figure 31:
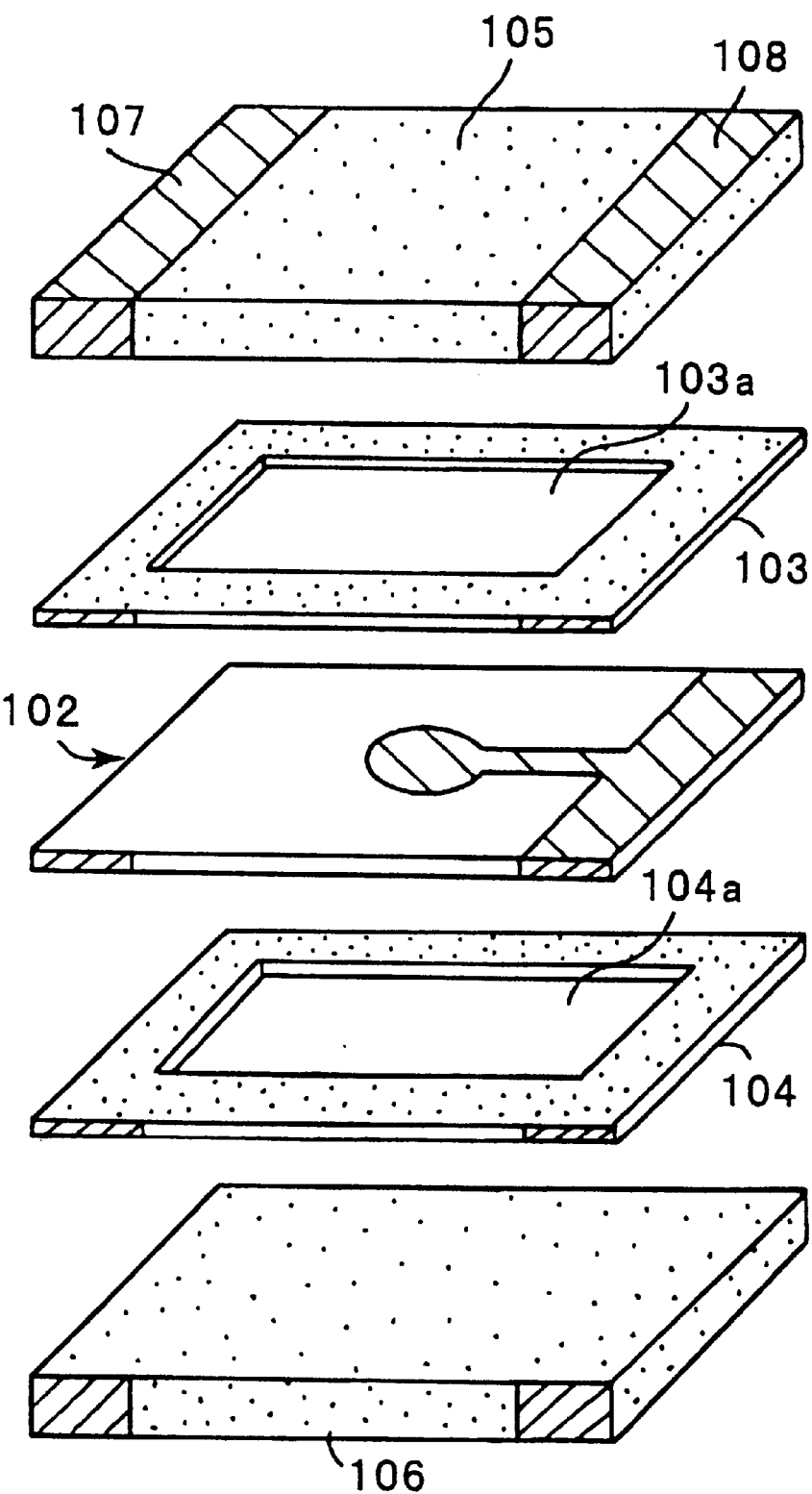
FIG. 31 is an exploded perspective view of another modified example of the capacitor-containing piezoelectric resonance component according to another preferred embodiment of the present invention.
Figure 32:
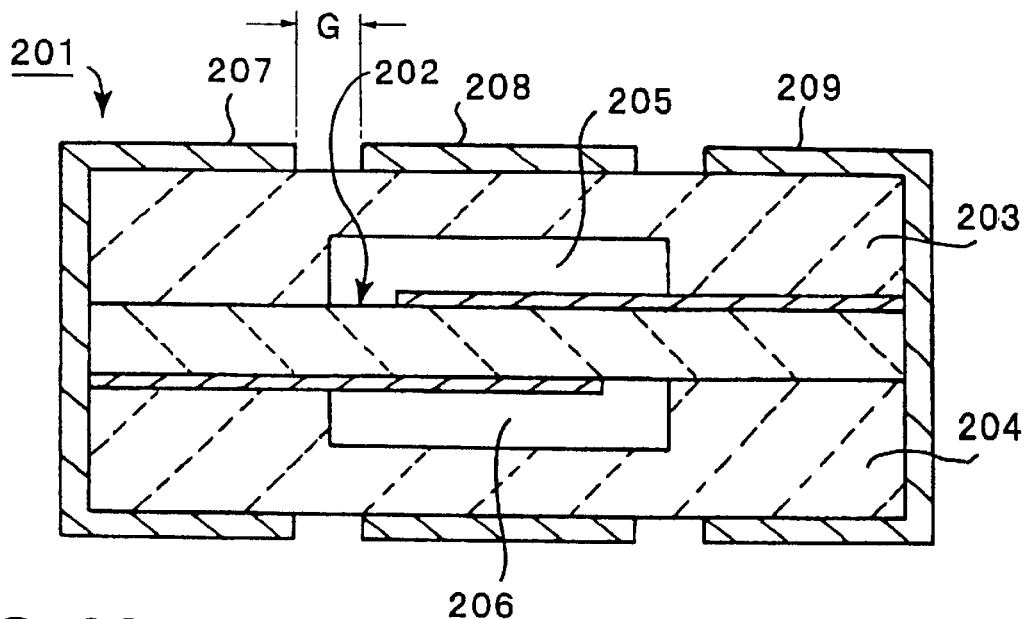
FIG. 32 is a cross-sectional view of a conventional capacitor-containing piezoelectric resonance component.
Figure 33:
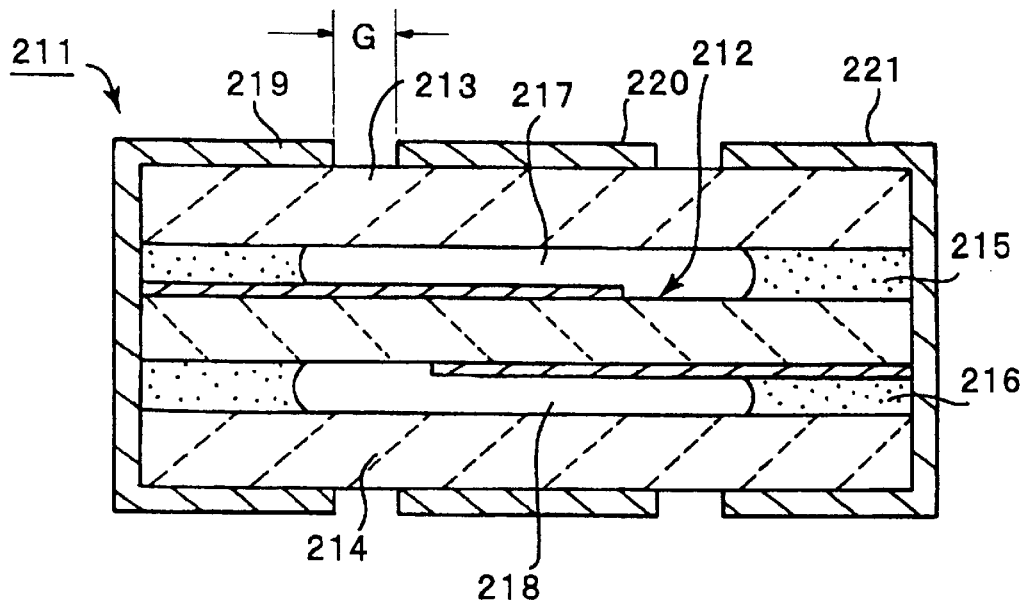
FIG. 33 is a cross-sectional view of another conventional capacitor-containing piezoelectric resonance component.

As shown in FIG. 31, dielectric layers that have, respectively, substantially rectangular openings 103a and 104a may be used. Alternatively, in the capacitor-containing piezoelectric resonance components shown in FIGS. 30 and 31, concave sections may be formed on inner surfaces of the casing substrates 105 and 106 instead of the dielectric layers 103 and 104 having the openings.

Although the present invention has been described referring to specific preferred embodiments shown in the figures, it is not restricted thereto. On the contrary, the present invention is intended to cover various other modifications and equivalent arrangements within the spirit and scope of the invention.

What is claimed is:

1. A capacitor-containing piezoelectric resonance component comprising:
    an energy-trap piezoelectric resonance element including a piezoelectric plate, and a first vibratory electrode and a second vibratory electrode disposed on portions of two main surfaces of the piezoelectric plate so that a lower surface and an upper surface thereof oppose each other via the piezoelectric plate;
    a dielectric substrate disposed on at least one surface of the piezoelectric resonance element with a vibratory space being defined therein and arranged to allow free and unhindered vibration of a vibrating section of the resonance element; and
    a first capacitor-forming electrode and a second capacitor-forming electrode arranged on the dielectric substrate so as to oppose each other via a predetermined gap G in a direction that is substantially parallel to the main surface of the dielectric substrate;
    wherein, when G' represents the distance between an end portion of the second capacitor-forming electrode and an end portion of the vibrating space along the direction in which the first capacitor-forming electrode and the second capacitor-forming electrode oppose each other, at least one of the expressions $G'/G \geq 1$ and $G'/G \leq -0.4$ is satisfied.

2. A capacitor-containing piezoelectric resonance component according to claim 1, wherein a pair of the first capacitor-forming electrodes is arranged to sandwich the second capacitor-forming electrode in the direction in which the pair of first capacitor-forming electrodes and the second capacitor-forming electrode oppose each other so as to be electrically connected to the piezoelectric resonance element, and the second capacitor-forming electrode is connected to a ground potential.

3. A capacitor-containing piezoelectric resonance component according to claim 1, wherein the dielectric substrate is disposed on each of two main surfaces of the piezoelectric resonance element and so that the vibration space is secured.

4. A capacitor-containing piezoelectric resonance component according to claim 1, further comprising a casing member, wherein the dielectric substrate is larger than the piezoelectric resonance element, and the casing member is fixed on the dielectric substrate so as to confine the piezoelectric resonance element.

5. A capacitor-containing piezoelectric resonance component according to claim 1, further comprising a casing substrate that is larger than the dielectric substrate and the piezoelectric resonance element and a casing cover member for confining the piezoelectric resonance element and the dielectric substrate, wherein the structure in which the piezoelectric resonance element and the dielectric substrate are disposed is mounted on the casing substrate, and the casing cover member is mounted to the casing substrate.

6. A capacitor-containing piezoelectric resonance component according to claim 1, wherein the first and second capacitor-forming electrodes oppose each other via the predetermined gap G on an outer surface of the dielectric substrate.

7. A capacitor-containing piezoelectric resonance component according to claim 1, wherein at least one of the first and second capacitor-forming electrodes is located at an intermediate height in the dielectric substrate and defines an inner electrode.

8. A capacitor-containing piezoelectric resonance component according to claim 1, wherein at least one of the first and second capacitor-forming electrodes is located on a surface of the dielectric substrate on the side where the dielectric substrate is disposed on the piezoelectric resonance element.

9. A capacitor-containing piezoelectric resonance component comprising:
    an energy-trap piezoelectric resonance element including a piezoelectric plate, and a first vibratory electrode and a second vibratory electrode that disposed on portions of two main surfaces of the piezoelectric plate so that a lower surface and an upper surface thereof oppose each other via the piezoelectric plate;
    a dielectric substrate located on at least one surface of the piezoelectric resonance element with a vibration space being defined therein to allow for free and unhindered vibration of a vibrating section of the resonance component; and
    a dielectric layer that is disposed between the piezoelectric resonance element and the dielectric substrate and that includes an opening provided for forming at least a portion of the vibration space;
    wherein, when $\epsilon_1$ represents the relative permittivity of the dielectric substrate and $\epsilon_2$ represents the relative permittivity of the dielectric layer, a relationship $\epsilon_2/\epsilon_1 \leq 0.063$ is satisfied.

10. A capacitor-containing piezoelectric resonance component according to claim 9, wherein a pair of the first capacitor-forming electrodes is arranged to sandwich the second capacitor-forming electrode in the direction in which the pair of first capacitor-forming electrodes and the second capacitor-forming electrode oppose each other so as to be electrically connected to the piezoelectric resonance element, and the second capacitor-forming electrode is connected to a ground potential.

11. A capacitor-containing piezoelectric resonance component according to claim 9, wherein the dielectric substrate is disposed on each of two main surfaces of the piezoelectric resonance element and so that the vibration space is secured.

12. A capacitor-containing piezoelectric resonance component according to claim 9, further comprising a casing member, wherein the dielectric substrate is larger than the piezoelectric resonance element, and the casing member is fixed on the dielectric substrate so as to confine the piezoelectric resonance element.

13. A capacitor-containing piezoelectric resonance component according to claim 9, further comprising a casing substrate that is larger than the dielectric substrate and the piezoelectric resonance element and a casing cover member for confining the piezoelectric resonance element and the dielectric substrate, wherein the structure in which the piezoelectric resonance element and the dielectric substrate are disposed is mounted on the casing substrate, and the casing cover member is mounted to the casing substrate.

14. A capacitor-containing piezoelectric resonance component according to claim 9, wherein the first and second capacitor-forming electrodes oppose each other via the predetermined gap G on an outer surface of the dielectric substrate.

15. A capacitor-containing piezoelectric resonance component according to claim 9, wherein at least one of the first and second capacitor-forming electrodes is located at an intermediate height in the dielectric substrate and defines an inner electrode.

16. A capacitor-containing piezoelectric resonance component according to claim 9, wherein at least one of the first and second capacitor-forming electrodes is located on a surface of the dielectric substrate on the side where the dielectric substrate is disposed on the piezoelectric resonance element.

17. A capacitor-containing piezoelectric resonance component comprising:
- an energy-trap piezoelectric resonance element including a piezoelectric plate, and a first vibratory electrode and a second vibratory electrode that are disposed on portions of two main surfaces of the piezoelectric plate so that a lower surface and an upper surface thereof oppose each other via the piezoelectric plate;
- a dielectric substrate disposed on at least one surface of the piezoelectric resonance element with a vibration space being defined therein to allow for free and unhindered vibration of a vibrating section of the resonance element;
- a dielectric layer that is disposed between the piezoelectric resonance element and the dielectric substrate and that includes an opening provided for forming at least a portion of the vibration space; and
- a first capacitor-forming electrode and a second capacitor-forming electrode that are arranged on the dielectric substrate so as to oppose each other via a predetermined gap G in a direction that is substantially parallel to the main surface of the dielectric substrate;
- wherein, when G' represents the distance between an end portion of the second capacitor-forming electrode and an end portion of the vibration space along the direction in which the first capacitor-forming electrode and the second capacitor-forming electrode oppose each other, $\epsilon_1$ represents the relative permittivity of the dielectric substrate, and $\epsilon_2$ represents the relative permittivity of the dielectric layer, at least one of the following relationships is satisfied $\epsilon_2/\epsilon_1 > 0.063$ and $G'/G > 0.2183\log(\epsilon_2/\epsilon_1) + 1.0682$ or $\epsilon_2/\epsilon_1 > 0.063$ and $G'/G \leq -0.3756\log(\epsilon_2/\epsilon_1) - 0.5734$.

18. A capacitor-containing piezoelectric resonance component according to claim 17, wherein a pair of the first capacitor-forming electrodes is arranged to sandwich the second capacitor-forming electrode in the direction in which the pair of first capacitor-forming electrodes and the second capacitor-forming electrode oppose each other so as to be electrically connected to the piezoelectric resonance element, and the second capacitor-forming electrode is connected to a ground potential.

19. A capacitor-containing piezoelectric resonance component according to claim 17, wherein the dielectric substrate is disposed on each of two main surfaces of the piezoelectric resonance element and so that the vibration space is secured.

20. A capacitor-containing piezoelectric resonance component according to claim 17, further comprising a casing member, wherein the dielectric substrate is larger than the piezoelectric resonance element, and the casing member is fixed on the dielectric substrate so as to confine the piezoelectric resonance element.

21. A capacitor-containing piezoelectric resonance component according to claim 17, further comprising a casing substrate that is larger than the dielectric substrate and the piezoelectric resonance element and a casing cover member for confining the piezoelectric resonance element and the dielectric substrate, wherein the structure in which the piezoelectric resonance element and the dielectric substrate are disposed is mounted on the casing substrate, and the casing cover member is mounted to the casing substrate.

22. A capacitor-containing piezoelectric resonance component according to claim 17, wherein the first and second capacitor-forming electrodes oppose each other via the predetermined gap G on an outer surface of the dielectric substrate.

23. A capacitor-containing piezoelectric resonance component according to claim 17, wherein at least one of the first and second capacitor-forming electrodes is located at an intermediate height in the dielectric substrate and defines an inner electrode.

24. A capacitor-containing piezoelectric resonance component according to claim 17, wherein at least one of the first and second capacitor-forming electrodes is located on a surface of the dielectric substrate on the side where the dielectric substrate is disposed on the piezoelectric resonance element.

* * * * *